United States Patent
Kawamura et al.

(10) Patent No.: US 6,426,560 B1
(45) Date of Patent: Jul. 30, 2002

(54) SEMICONDUCTOR DEVICE AND MEMORY MODULE

(75) Inventors: Masayasu Kawamura, Higashiyamato; Atsushi Nakamura, Musashino; Yoshihiro Sakaguchi, Higashimurayama; Yoshitaka Kinoshita, Akishima; Yasushi Takahashi, Saitama; Yoshihiko Inoue, Fukuoka, all of (JP)

(73) Assignees: Hitachi, Ltd.; Hitachi ULSI Systems Co., Ltd., both of Tokyo; Hitachi Tohbu Semiconductor, Ltd., Takasaki, all of (JP)

( * ) Notice: Subject to any disclaimer, the term of this patent is extended or adjusted under 35 U.S.C. 154(b) by 0 days.

(21) Appl. No.: 09/608,149

(22) Filed: Jun. 30, 2000

(30) Foreign Application Priority Data

Aug. 6, 1999 (JP) .......................................... 11-224122

(51) Int. Cl.⁷ ..................... H01L 27/108; H01L 25/65; G11C 5/02; G11C 25/65
(52) U.S. Cl. ......................... 257/777; 257/735; 257/773
(58) Field of Search ................................ 257/734, 777, 257/787, 735, 773; 438/106, 110

(56) References Cited

U.S. PATENT DOCUMENTS 5,508,565 A * 4/1996 Hatakeyama ............... 257/777
5,781,495 A * 7/1998 Arimoto ................. 365/230.03
5,917,242 A * 6/1999 Ball ........................... 257/737
5,982,043 A * 11/1999 Iwata ......................... 257/786

FOREIGN PATENT DOCUMENTS

| EP | 0408779 | * 1/1991 | |
|---|---|---|---|
| JP | 6020387 | 2/1985 | |
| JP | 60130139 | 7/1985 | |
| JP | 60171687 | 9/1985 | |
| JP | 62146495 | 6/1987 | |
| JP | 62262291 | 11/1987 | |
| JP | 4-222989 | 8/1992 | |
| JP | 6-61379 | * 3/1994 | ............... 257/723 |
| JP | 7-30051 | * 1/1995 | |
| JP | 9-306940 | * 11/1997 | |

* cited by examiner

Primary Examiner—Howard Weiss
Assistant Examiner—Marcos D. Pizarro-Crespo
(74) Attorney, Agent, or Firm—Antonelli, Terry, Stout & Kraus, LLP

(57) ABSTRACT

Two memory chips each being subjected to memory accesses in 2-bit units are assembled into a stacked structure by placing their back surfaces one over the other, so as to make memory accesses in 4-bit units. A memory module is so constructed that a plurality of such semiconductor storage devices, in each of which two memory chips each being subjected to memory accesses in 2-bit units are assembled into a stacked structure by placing their back surfaces one over the other, so as to make memory accesses in 4-bit units, are mounted on a mounting circuit board which is square and which is formed with electrodes along one latus thereof.

18 Claims, 15 Drawing Sheets

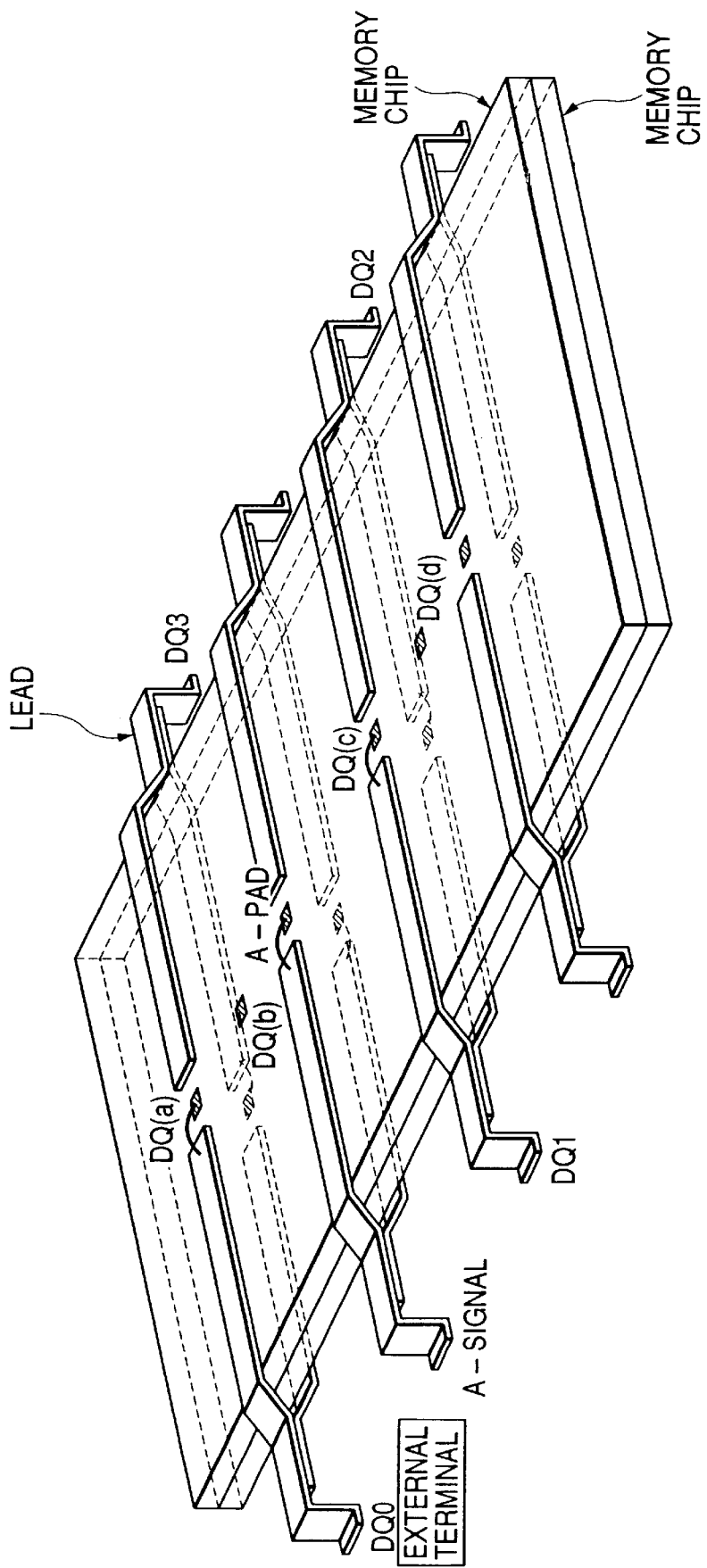

UPPER

LOWER

SEMICONDUCTOR DEVICE AND MEMORY MODULE

BACKGROUND OF THE INVENTION

This invention relates to a semiconductor storage device and a memory module, and to techniques which are effective when utilized chiefly in a universal semiconductor storage device such as dynamic RAM (Random Access Memory), and a memory module employing the semiconductor storage device.

An investigation conducted after the completion of the present invention has revealed that there is the official gazette of Japanese Patent Application Laid-open No. 222989/1992 as a document which is thought to be relevant to the present invention to be described later. The technique of the official gazette consists in the contrivance that stress—strain states which appear within a plurality of chips are uniformalized among the chips, the states being ascribable to heat generation during the operation of a semiconductor integrated circuit device in which the chips are sealed in a single package, and an example which realizes a double storage capacity by employing two memory chips is disclosed in paragraph 0031 in the official gazette. The official gazette does not contain any statement to the effect that, as in the invention of the present application to be described later, the thickness (in the direction of the height) of the semiconductor integrated circuit device viewed as one semiconductor storage device is made equal to or less than the thickness of a universal semiconductor storage device having an equal storage capacity.

By the way, memories each having output terminals of 2-bit configurations are stated in the official gazettes of Japanese Patent Applications Laid-open no.20387/1985, No. 130139/1985, No. 171687/1985, No.146495/1987 and No. 262291/1987.

SUMMARY OF THE INVENTION

In the case where a plurality of chips are sealed into one package in this manner, the resulting device merely sealed becomes a unique semiconductor storage device, the uses of which are limited. For the purpose of permitting a semiconductor storage device to be widely utilized, it is important to provide this device with compatibility with the existing semiconductor storage devices. According to the semiconductor integrated circuit device in the aforementioned official gazette, the memory chips are held in a stacked structure so that the front surfaces (main surfaces) thereof may be opposite to each other, and a height for wire bonding which executes connections with leads is required over each of the front surfaces of the two chips, so that the package thickens inevitably.

Since packages have a tendency to be more thinned in universal semiconductor storage devices, it is difficult to realize a thickness equal to the thickness of the universal semiconductor storage device having an equal storage capacity by the technique stated in the aforementioned official gazette. In order to realize a large storage capacity within a small volume, each of semiconductor storage devices is often used in the way that memory chips are mounted on both surfaces of a mounting circuit board, thereby to construct a memory module, and that a plurality of such memory modules are plugged into a plurality of connectors which are juxtaposed on a mother board. In this case, the intervals of the individual connectors are set as near as possible. Therefore, the memory modules need to be formed by matching the overall thickness with, at least, the pitches of the connectors. Considering the radiation of heat during a memory operation, however, the memory modules should desirably be spaced from one another even if slightly.

As a result of the study stated above, the inventors of the present application have found it very important that, when two memory chips are mounted in a single package so as to realize a double storage capacity, the thickness of such a package is made equal to or less than the thickness of an existing semiconductor storage device in which a single memory chip is mounted.

An object of this invention is to provide a semiconductor storage device which can be formed thin while employing two memory chips. Another object of this invention is to provide a semiconductor storage device which has an excellent universality while employing two memory chips. Still another object of this invention is to provide a memory module which is capable of increasing the storage capacity per unit volume and high-density packaging. A further object of this invention is to provide a memory module which is well adapted for use. The above and other objects and novel features of this invention will become apparent from the description of this specification and the accompanying drawings.

A typical one of inventions disclosed in the present application is briefly summarized as follows: Two memory chips each being subjected to memory accesses in 2-bit units are assembled into a stacked structure by placing their back surfaces one over the other, so as to make memory accesses in 4-bit units.

Another typical one of the inventions disclosed in the present application is briefly summarized as follows: A memory module is so constructed that a plurality of semiconductor storage devices, in each of which two memory chips each being subjected to memory accesses in 2-bit units are assembled into a stacked structure by placing their back surfaces one over the other, so as to make memory accesses in 4-bit units, are mounted on a mounting circuit board which is square and formed with electrodes (connectors) along one latus thereof.

BRIEF DESCRIPTION OF THE DRAWINGS

FIG. 1 is a schematic perspective view of essential portions showing an embodiment of a semiconductor storage device according to this invention;

DETAILED DESCRIPTION OF THE INVENTION

Figure 2A:
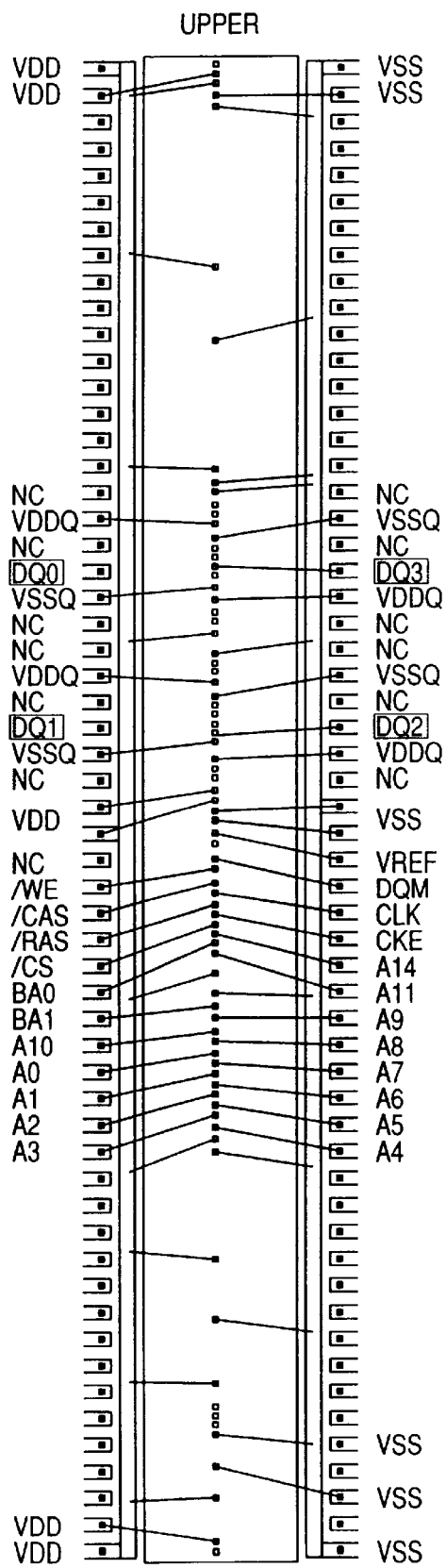
FIGS. 2A and 2B schematic pattern diagram showing an embodiment of two memory chips which are made into the stacked structure of the semiconductor storage device according to this invention.

Shown in FIG. 1 is a perspective view of the essential portions of one embodiment of a semiconductor storage device according to this invention. In this embodiment, two memory chips are held in a structure in which they are stacked back to back within an identical package. That is, the memory chips are placed one over the other so that the back sides of these memory chips may be opposite to each other, and that the front surfaces thereof, on each of which bonding pads, etc. are formed, may face outwards. In the figure, among a large number of leads necessary for the package and the memory chips, some relevant to data terminals are representatively exemplified in order to facilitate understanding the invention.

A method for easily enlarging a semiconductor storage device is a technique in which two memory chips are mounted in a single package as stated in the official gazette mentioned before. Heretofore, in a 64-Mbit DRAM, 128 Mbits have been realizable when two 64-Mbit chips, in each of which x4, x8 and x16 bits are existent, are stacked and assembled into one package. Likewise, 512 Mbits have been realizable when two 256-Mbit chips are assembled into one package. Such a stacking scheme has come into the limelight for inexpensive uses because it can shorten the development period than in the new development of a single chip of 128 Mbits or 512 Mbits. With the bit configuration of a prior-art single chip of x4 bits or more, however, only x8 bits or more have been realizable as the number of bits even when such chips are stacked. With the stacking scheme as stated above, therefore, it has been impossible to fabricate any x4-bit product with 128 Mbits or 512 Mbits.

Moreover, when the two memory chips are assembled into one package as stated in the official gazette, the whole package thickens more as compared with the package of a semiconductor storage device which has a storage capacity equal to the total storage capacity of the two memory chips. Even when external terminals are equally arrayed, there occurs the problem that they cannot be matched with the pitches of connectors assembled at a high density in the case of mounting the memory chips in a memory module as explained later. In other words, the semiconductor storage device having the two memory chips becomes incompatible with a semiconductor storage device in which one memory chip is mounted in one package.

In the invention of the present application, two memory chips each of which can be set into a x2-bit configuration are made into a stacked structure, thereby to construct a semiconductor storage device of x4-bit configuration. In this case, the stacked structure is so contrived as to join the back surfaces of the two memory chips, in order that the total thickness of the memory chips to be assembled into the single package stated above may be equalized to the thickness of the package in which one chip is mounted. In this structure, the back surfaces of the memory chips are prevented to the utmost from coming into touch with a sealing resin which constitutes the single package. This is considerably different from the prior-art semiconductor integrated circuit device which is so constructed that the whole semiconductor chips including the back surfaces and front surfaces thereof are in touch with the sealing resin for the purpose of sealing. Owing to such a contrivance, the invention attains the thinning of the semiconductor storage device while adopting the stacked structure.

More specifically, in this embodiment, the memory chips are disposed back to back as described above, whereby the sealing resin at the back surface parts as is contained in the prior-art semiconductor integrated circuit device can be decreased to thin the package to that extent. As a result, the thickness of the package in this embodiment can be equalized to that of the package of the existing semiconductor storage device having the equal storage capacity, even when the two memory chips are accommodated in the single package by arranging leads of LOC (Lead On Chip) structure on both the upper and lower surfaces of the memory chip assembly as shown in the figure, and connecting these leads and the bonding pads of the memory chips by pieces of bonding wire.

In such a stacked structure, address terminals and control terminals which are disposed back to back in the respective memory chips need to have the corresponding leads connected in common outside. In the two memory chips, therefore, the relations between the leads and the bonding pads are set to be inverse laterally. In contrast, when the corresponding ones of the data terminals are connected in common outside likewise to the address terminals as stated above, data items each being of x2 bits collide at an external terminal.

In this embodiment, accordingly, the address terminals etc. are held in mirror inversion between in the upper memory chip and lower memory chip of the stacked structure, whereupon the leads and the bonding pads are connected. In contrast, the two data terminals are connected with the two leads on the same side as viewed from the main surface of each memory chip. More specifically, in the illustrated example, each of leads for data formed as external terminals DQ0 and DQ1 extends toward both the upper memory chip and the lower memory chip, and the upper leads are respectively connected to the pads DQ(a) and DQ(c) of the upper memory chip through the wire pieces, while the lower leads are not connected to any of the pads of the lower memory chip.

Each of leads for data formed as external terminals DQ3 and DQ2 extends toward both the upper memory chip and the lower memory chip, and the lower leads are respectively connected to the pads DQ(a) and DQ(c) of the lower memory chip through the wire pieces, while the upper leads are not connected to any of the pads of the lower memory chip. The pad arrangement of the lower memory chip and that of the upper memory chip are similar, and pads DQ(b) and DQ(d) representatively shown on the upper memory chip are used together with the above pads DQ(a) and DQ(c) in the case where data are outputted in 4-bit units from one of the memory chips.

Accordingly, the pads DQ(b) and DQ(d) are not used in the embodiment of FIG. 1. The lead of A-signal is connected to pads A-PAD and B-PAD which are formed on the respective memory chips at the distal ends of both its leads extending toward the upper memory chip and the lower memory chip, so that the identical A-signal is supplied in common to both the memory chips. Regarding the leads for data, the leads on the side on which they are not connected may be cut away in order to lower input/output capacitances as will be explained later.

Figure 2B:
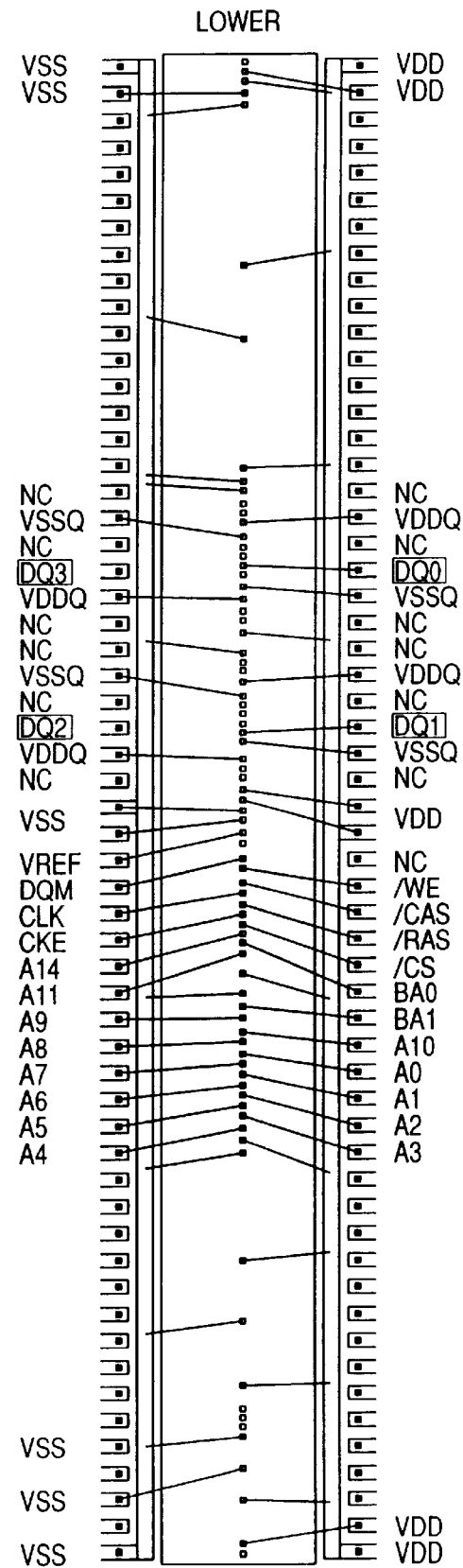

Shown in FIGS. 2A and 2B are schematic pattern diagrams of one embodiment of the two memory chips which are made into the stacked structure of the semiconductor storage device according to this invention. FIG. 2A shows the memory chip on the upper side (UPPER) and the leads and bonding wire pieces corresponding thereto, while FIG. 2B shows the memory chip on the lower side (LOWER) and the leads and bonding wire pieces corresponding thereto.

In the memory chips of this embodiment, the x2-bit configuration, the x4-bit configuration, the x8-bit configuration and the x16-bit configuration can be selected by a metal option, a bonding option or the combination thereof as will be explained later. The leads are shown in the maximum number so that they can cope with a plurality of these sorts of bit configurations. This embodiment exemplifies the leads and the bonding wire pieces in the case where each memory chip has a storage capacity of 256 Mbits in the x2-bit configuration. It is accordingly to be understood that the leads with no signal names affixed thereto are the ones which are not existent in the above memory of the x2-bit configuration.

The memory chip has the bonding pads arranged substantially rectilinearly, substantially on the center line thereof in the longitudinal direction thereof. Such a construction in which the bonding pads are aligned, becomes a very useful array of the bonding pads in the case to be explained later where the two memory chips are made into the stacked structure back to back as stated above, where the leads such as address terminals and control terminals are made common outside, and where the resulting structure is mounted in the single package.

Those lead terminals of the upper memory chip and lower memory chip which have signal names are arranged in lateral symmetry on the drawing, except for the leads for data, DQ0 through DQ3 enclosed with rectangles. For example, the respective leads arranged on the right side of the upper memory chip UPPER agree with the leads which are arranged on the left side of the lower memory chip LOWER, and which are obtained by the mirror inversion with respect to the center line of the memory chip in the longitudinal direction thereof. Conversely, the respective leads arranged on the left side of the upper memory chip UPPER agree with the leads which are arranged on the right side of the lower memory chip LOWER, and which are obtained by the mirror inversion with respect to the center line of the memory chip in the longitudinal direction thereof.

As described above, those leads of the upper memory chip UPPER and lower memory chip LOWER to which the same signals are fed are arranged so as to be laterally inverse. Here, in the case where the bonding pads are aligned as stated before, the bonding wire pieces may be arranged for the leads so as to be laterally inverse between the upper side and the lower side. In FIG. 2, the leads and bonding wire pieces of the memory chip LOWER are arrayed in agreement with those of the memory chip UPPER reflected in a mirror which is put on the right side of the memory chip UPPER. Regarding the leads for data, DQ0 through DQ3, however, the bonding wire pieces are connected to the leads DQ3 and DQ2 on the right side in the upper memory chip UPPER, while the bonding wire pieces are connected to the leads DQ0 and DQ1 on the right side in the lower memory chip LOWER. That is, the bonding pads of the memory chips and the leads to be connected thereto lie at the same positions, but the lead names are made different as stated above.

In this embodiment, a pair of leads are extended in the longitudinal direction of each memory chip and are respectively connected to leads for the voltage VDD of a power supply and the ground potential VSS of circuitry at the upper and lower ends of the chip. The pair of leads are formed as bus bars, and are respectively used for appropriately feeding the power supply voltage VDD and circuital ground potential VSS to the memory chip through low power supply impedances. The bus bars VDD and VSS are also arranged in the mirror inversion form between in the upper memory chip UPPER and in the lower memory chip LOWER.

In the case where the two memory chips as explained above are made into the structure in which they are stacked back to back so as to be joined at the back surfaces, the address terminals and the control terminals have the respectively corresponding leads placed one over the other vertically and connected in common. In contrast, each of the data terminals has the two leads laterally separated from each other and electrically isolated from each other in the stacked structure, whereby the data terminals DQ0 through DQ3 of x4 bits can be formed.

Figure 3:
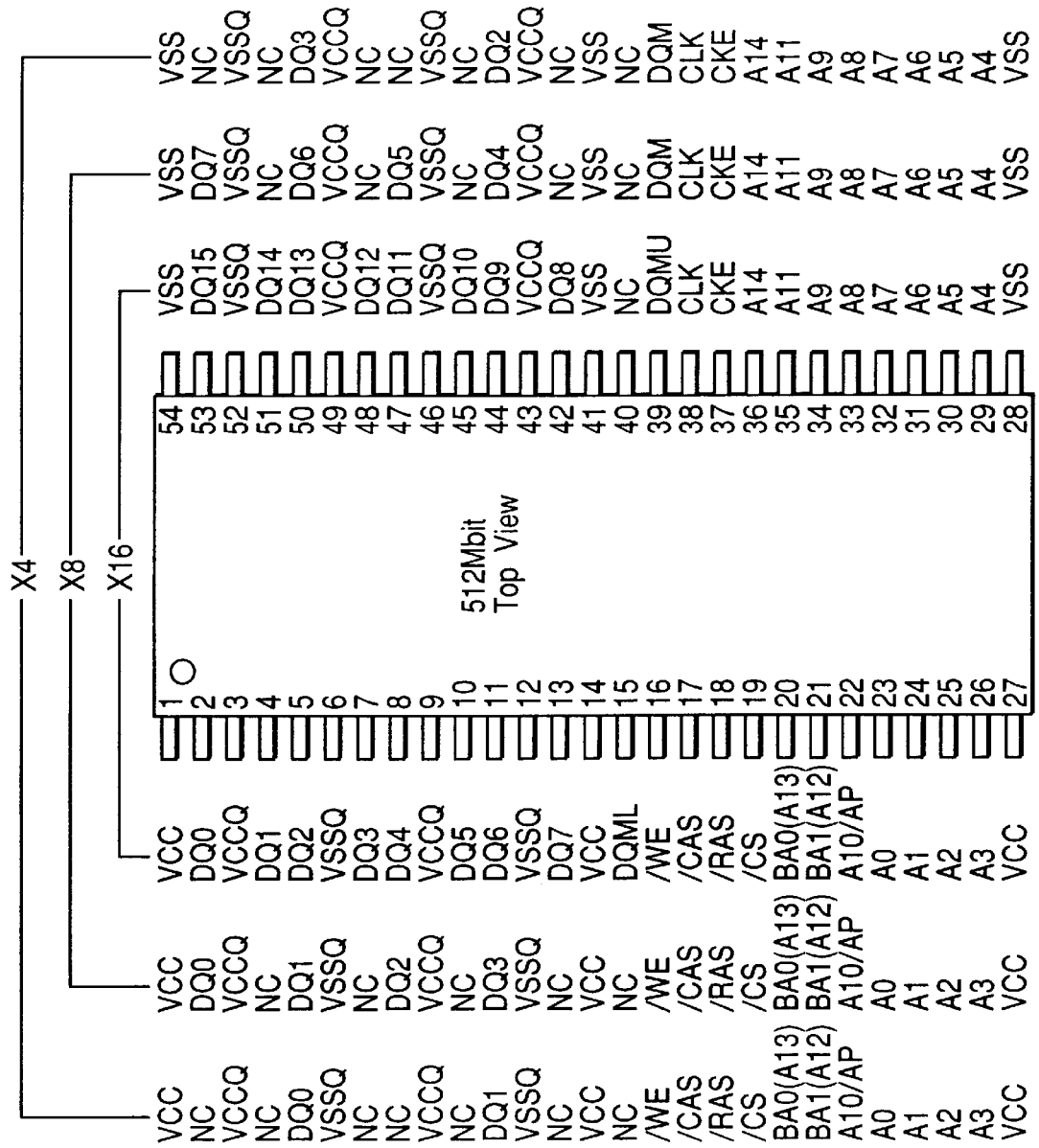
FIG. 3 is a top plan view showing an embodiment of the semiconductor storage device according to this invention.

Shown in FIG. 3 is a top plan view of one embodiment of the semiconductor storage device according to this invention. In this embodiment, the memory chips each being of 256 Mbits are made into the stacked structure as explained above and are mounted in the single package, so as to have the storage capacity of 512 Mbits in total. This embodiment illustrates pin arrays in the cases where the two memory chips are set into the x2-, x4- and x8-bit configurations, thereby to realize the three sorts of bit configurations of x4 bits, x8 bits and x16 bits, respectively.

In this embodiment, a power supply terminal VCC corresponds to the power supply leads VDD mentioned before, and power supply terminals VCCQ and VSSQ are used for feeding the voltage VCC of a power supply and the ground potential VSS of circuitry therefrom without being connected to the bus bars. The power supply voltages VCCQ and VSSQ serve to feed an operating voltage for an output buffer. Thus, power supply noise having developed in the output buffer is prevented from propagating to any other internal circuit through the bus bars inside the semiconductor storage device. It is consequently possible to stabilize the operations of internal circuits.

In this embodiment, the two memory chips each being of 256 Mbits are mounted back to back in the standard package of 54 pins. Of course, the package has a thickness specified as a standard.

Figure 4:
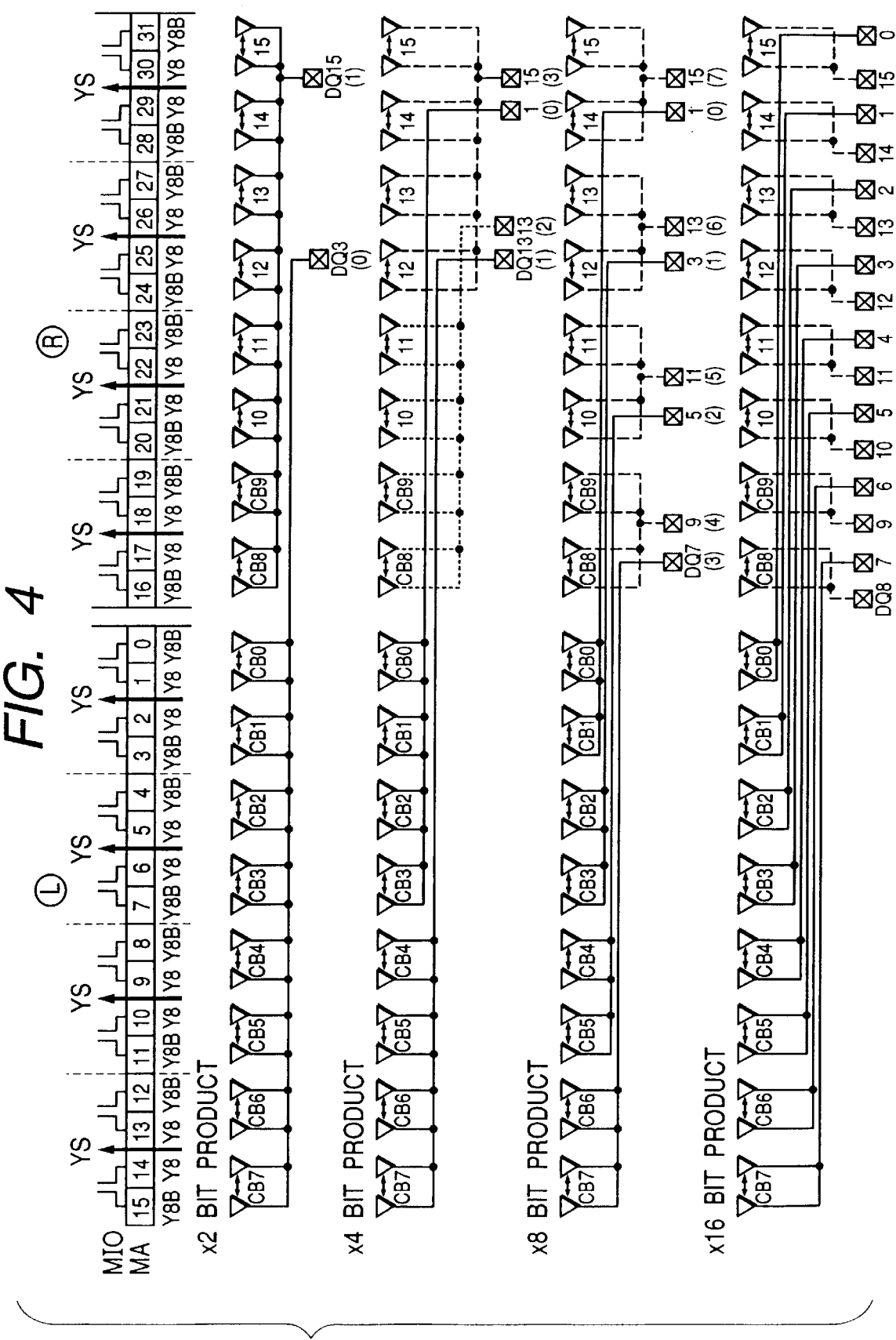
FIG. 4. is an output system diagram showing an embodiment of the semiconductor storage device according to this invention.

Shown in FIG. 4 is an output system diagram of one embodiment of the semiconductor storage device according to this invention. Although not especially restricted, this embodiment illustrates an example which employs memory chips each having a storage capacity of 64 Mbits, and it shows the relationships between memory array positions and DQ Nos. in a normal mode. In this embodiment, one can be selected from among the four sorts of bit configurations of a x2-bit product, a x4-bit product, a x8-bit product and a x16-bit product. As will be explained later, a memory array corresponding to one memory bank is divided into 16 subarrays, two pairs of main input/output lines (MIO) are laid from each of the subarrays, and 32 main amplifiers are disposed in correspondence with the lines MIO. The 16 subarrays are subdivided into left and right (L/R) groups each consisting of 8 subarrays.

In the x2-bit product, the left and right halves of the memory array correspond to the data terminals DQ0 and DQ1 as indicated by the symbols L and R, respectively. In this embodiment, a selection signal YS is generated in accordance with address signals A0 through A7, and signals are delivered from one memory bank to the 32 pairs of MIO (main input/output lines). As stated above, the 32 pairs of MIO are separated into the two sets of the left L and right R sets each consisting of 16 pairs. In the x2-bit product, buffer circuits BC disposed in the number of 32 in correspondence with the main amplifiers MA are separated into two sets which correspond to the sets L and R, and which are respectively connected in common to data terminals DQ3(0) and DQ15(1).

Eight of the 16 main amplifiers of each set are selected in accordance with a column selection signal Y8 or Y8B formed by an address signal A8, and one main amplifier MA is finally selected from among each of the sets L and R in accordance with address signals A9, A10 and A11 not shown, whereby data of 2 bits are respectively delivered from the output terminals DQ3(0) and DQ15(1) through the buffer circuits CB corresponding to the selected main amplifiers MA. Here, (0) and (1) indicate terminal Nos. in the case of the x2-bit configuration. In the ensuing description, this shall hold true also of the other bit configurations.

In the x4-bit product, the output lines of the buffer circuits CB are separated into four sets. The address signal A11 for selecting the main amplifiers MA is correspondingly invalidated (degenerated), whereby data are read out in 4-bit units. In the x8-bit product, the output lines of the buffer circuits CB are separated into eight sets, and the address signals A11 and A10 for selecting the main amplifiers MA are invalidated (degenerated), whereby data are read out in 8-bit units. Besides, in the x16-bit product, the output lines of the buffer circuits CB are separated into 16 sets, and the address signals A11, A10 and A9 for selecting the main amplifiers MA are invalidated (degenerated), whereby data are read out in 8-bit units.

Figure 5:
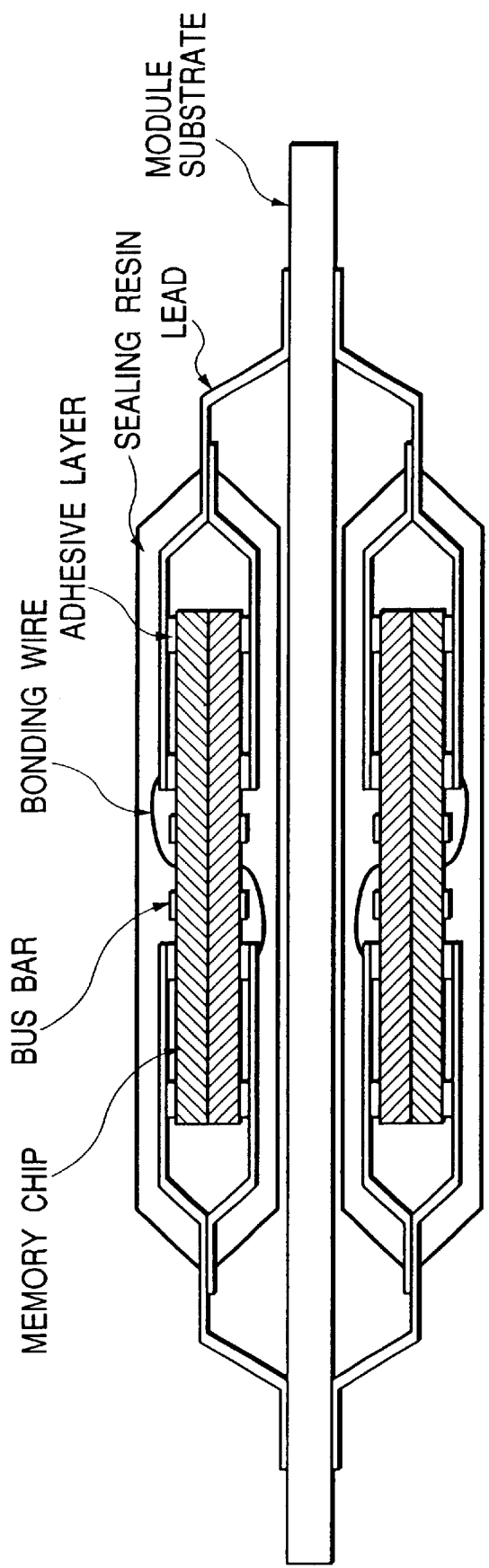
FIG. 5 is a sectional view of essential portions showing an embodiment of a memory module which employs semiconductor storage devices according to this invention.

Shown in FIG. 5 is a sectional view of the essential portions of one embodiment of a memory module employing semiconductor storage devices according to this invention. The semiconductor storage devices each of which has memory chips held back to back, are mounted on both surfaces of a module substrate. Leads are bonded onto the memory chips through adhesive layers. Bus bars which extend orthogonally to the extending direction of the leads, have adhesive layers therefor formed thin so as to be smaller in height than the leads. Thus, a margin in a height direction can be enlarged in order to prevent the bus bars from being touched by pieces of wire which connect the selected ones of the leads and bonding pads provided on the front surfaces of the memory chips.

Each of the semiconductor storage devices mounted on both surfaces of the module substrate is constructed as the stacked structure of the two memory chips as explained before. Herein, since the stacked structure is formed so as to place the back surfaces of the memory chips one over the other, the thickness of a sealing resin can be set small. That is, the semiconductor storage device of this embodiment can be assembled into a package having a thickness equal to that of the ordinary semiconductor storage device in which only one memory chip is mounted and which has a storage capacity being half of that of the device of this embodiment, and it can be replaced with a memory module which employs the ordinary semiconductor storage device. By such replacement with the memory module, the storage capacity can be doubled for the same packaging volume, and a packaging area can be reduced to half for the same storage capacity.

As shown in FIG. 1, FIG. 2 and FIG. 5, the semiconductor storage device according to the present invention is sealed in the state where the back surfaces of the first and second memory chips (that is, the upper and lower memory chips) are placed one over the other. It includes the first lead DQ0 and second lead DQ1 which extend from the first latus of the sealed structure to the inside and outside this sealed structure, and the third lead DQ2 and fourth lead DQ3 which extend from the second latus of the sealed structure opposite to the first latus to the inside and outside this sealed structure.

Each of the first and second memory chips includes the first terminal DQ(a), second terminal DQ(b), third terminal DQ(c) and fourth terminal DQ(d) for outputting data, which are arranged along a straight line being parallel to the longer latera of each memory chip and passing through the central parts of the shorter latera thereof, on the circuit forming surface of each memory chip. The second terminal DQ(b) is arranged at a position nearer to the first terminal DQ(a) between this first terminal DQ(a) and the third terminal DQ(C), while the third terminal DQ(c) is arranged at a position nearer to the fourth terminal DQ(d) between the second terminal DQ(b) and this fourth terminal DQ(d).

The first lead DQ0 and fourth lead DQ3 are arranged at positions which oppose with the straight line held therebetween, while the second lead DQ1 and third lead DQ2 are arranged at positions which oppose with the straight line held therebetween. Each of the first and second memory chips outputs data in 2-bit units by employing either of the first and second terminals, for example, the first terminal DQ(a), and either of the third and fourth terminals, for example, the third terminal DQ(c), whereby data are outputted from the first, second, third and fourth leads in 4-bit units in total. By the way, in FIG. 1, terminals corresponding to the second terminal DQ(b) and the fourth terminal DQ(d) are not depicted in the lower memory chip, and they have been omitted from illustration in order to avoid the complicacy of the drawing. In actuality, the upper chip and the lower chip have similar constructions, and the respective terminals exist in correspondence.

Here, the data outputting in 2-bit units and the data outputting in 4-bit units can be selected for the first and second memory chips. In the case of executing the data outputting in 4-bit units, the first terminal DQ(a), second terminal DQ(b), third terminal DQ(c) and fourth terminal DQ(d) are employed as explained before. The positional relations of these terminals as stated above are determined in accordance with the normalized positions of the corresponding leads. That is, the individual terminals are arranged in such positional relations that the wire pieces can be shortened when the leads and terminals corresponding to each other are to be connected by these wire pieces. In other words, the first terminal DQ(a) and second terminal DQ(b)

of each memory chip are arranged near the first lead DQ0 and fourth lead DQ3, while the third terminal DQ(c) and fourth terminal DQ(d) of each memory chip are arranged near the second lead DQ1 and third lead DQ2.

In the case of the data outputting in 2-bit units, each memory chip can employ any two of the four data terminals in any desired combination. The inventors' study, however, has revealed that the first and second memory chips should preferably execute the outputting in 2-bit units by employing either of the first and second terminals (for example, the first terminal DQ(a)) and either of the third and fourth terminals (for example, the third terminal DQ(c)), respectively, as stated in this embodiment.

More specifically, the first terminal DQ(a) and third terminal DQ(c) of the first memory chip can be easily connected to the first lead DQ0 and second lead DQ1 extending near these terminals, by using the wire pieces, respectively. In addition, the first terminal DQ(a) and third terminal DQ(c) of the first memory chip can be easily connected to the fourth lead DQ3 and third lead DQ2 extending near these terminals, by using the wire pieces, respectively.

On the other hand, when data are outputted from the individual memory chips in 2-bit units by employing the first terminal DQ(a) and second terminal DQ(b), these terminals concerning the first memory chip can be easily connected to the first lead DQ0 and fourth lead DQ3 extending near them, by using the wire pieces, respectively. Concerning the second memory chip, however, the first terminal DQ(a) and second terminal DQ(b) must be connected to the second lead DQ1 and third lead DQ2 which are distant from these terminals, respectively. It is unfavorable to connect the distant leads and terminals through the wire pieces in this manner for the reason that short-circuiting with any other wire piece and increases in the parasitic capacitances of the wire pieces are incurred.

Figure 15:
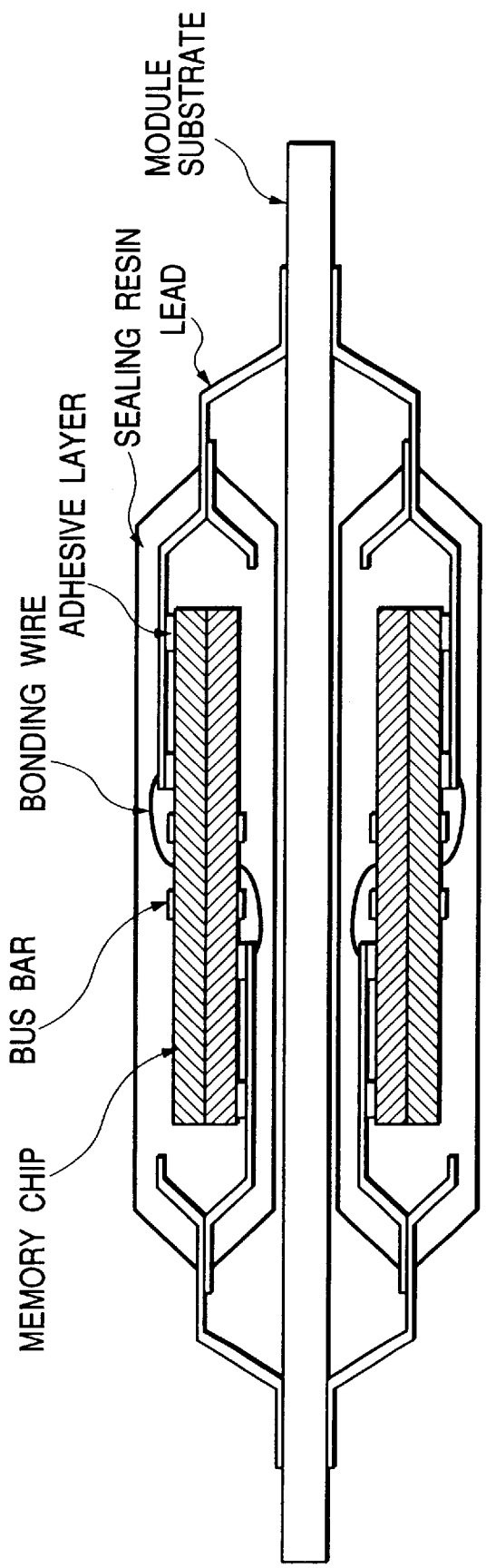
FIG. 15 is a sectional view of essential portions showing a further embodiment of the memory module employing semiconductor storage devices according to this invention.
Figure 16:
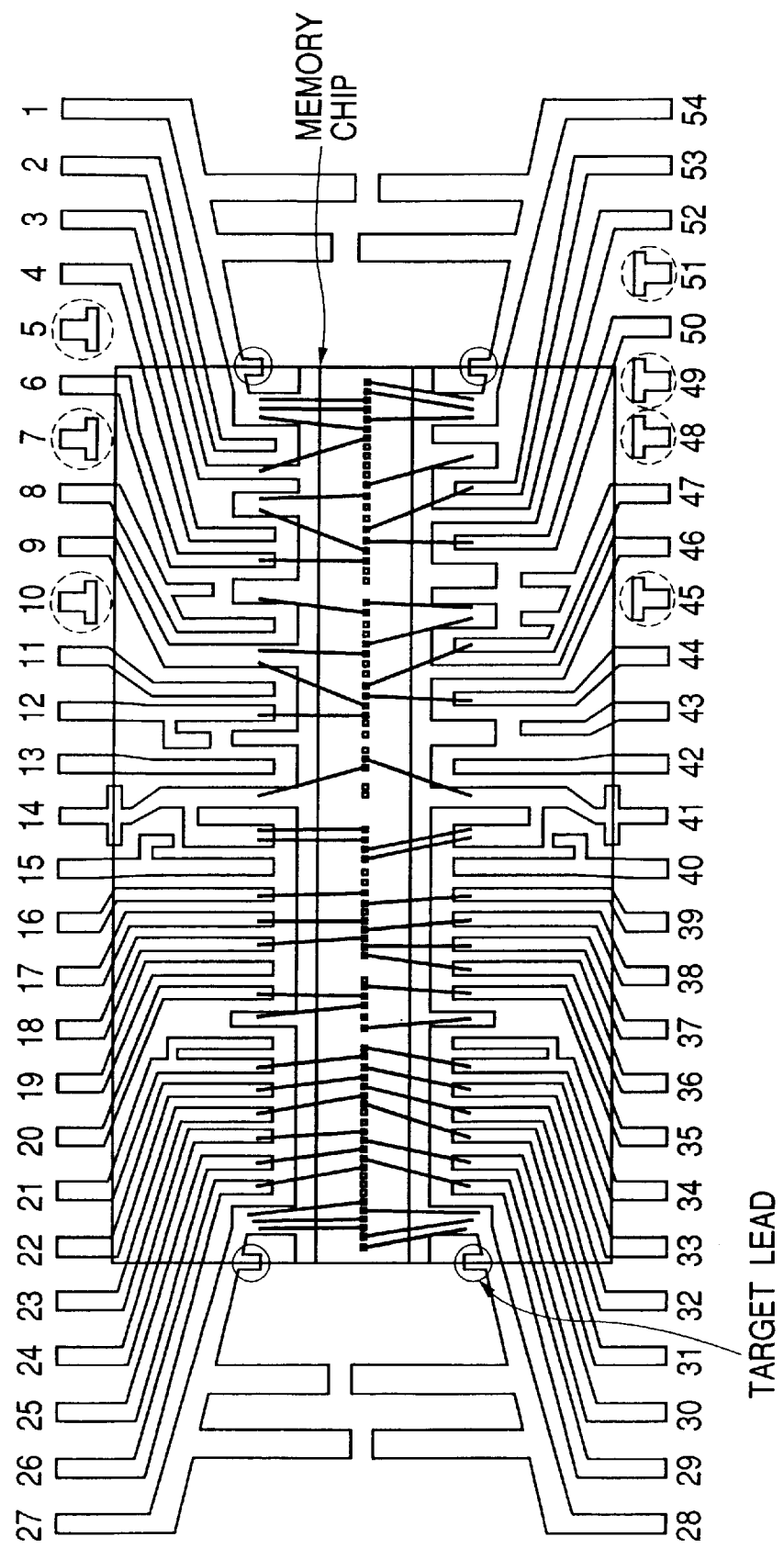
FIG. 16 is a plan view for explaining the relationship between one of the memory chips and a lead frame in the semiconductor storage device according to this invention.

It is important for improving signal transmission speeds to lower the parasitic capacitances of signal lines. In this regard, the leads for data, which extend toward the memory chips but which are not connected, are shortened as in an embodiment illustrated in FIG. 15, whereby the parasitic capacitances of the leads can be lowered. In this embodiment, the leads for data not to be connected are cut at the end parts of the memory chips. It is also possible, however, to omit such non-connected data leads themselves. Shown in FIG. 16 is a plan view for explaining the relationship between the memory chip and a lead frame. The memory chip and leads illustrated are those of one of the two memory chips. As indicated by a lead enclosed with a broken line, each of the leads to be cut among a plurality of leads is formed in the shape of the alphabetic letter T facing toward the memory chip, so as not to fall off the sealing resin.

Referring to FIG. 1, the first lead DQ0 should preferably be cut at or ahead of a position where it bifurcates toward the upper memory chip and the lower memory chip. Alternatively, leads having shapes after the cutting may be formed at the beginning of manufacture. That is, the asymmetric construction of each data lead concerning the lengths thereof extending toward the first and second memory chips can improve the signal transmission speed on the basis of the lowering of the parasitic capacitance, over the symmetric construction concerning the extending lengths.

Figure 6:
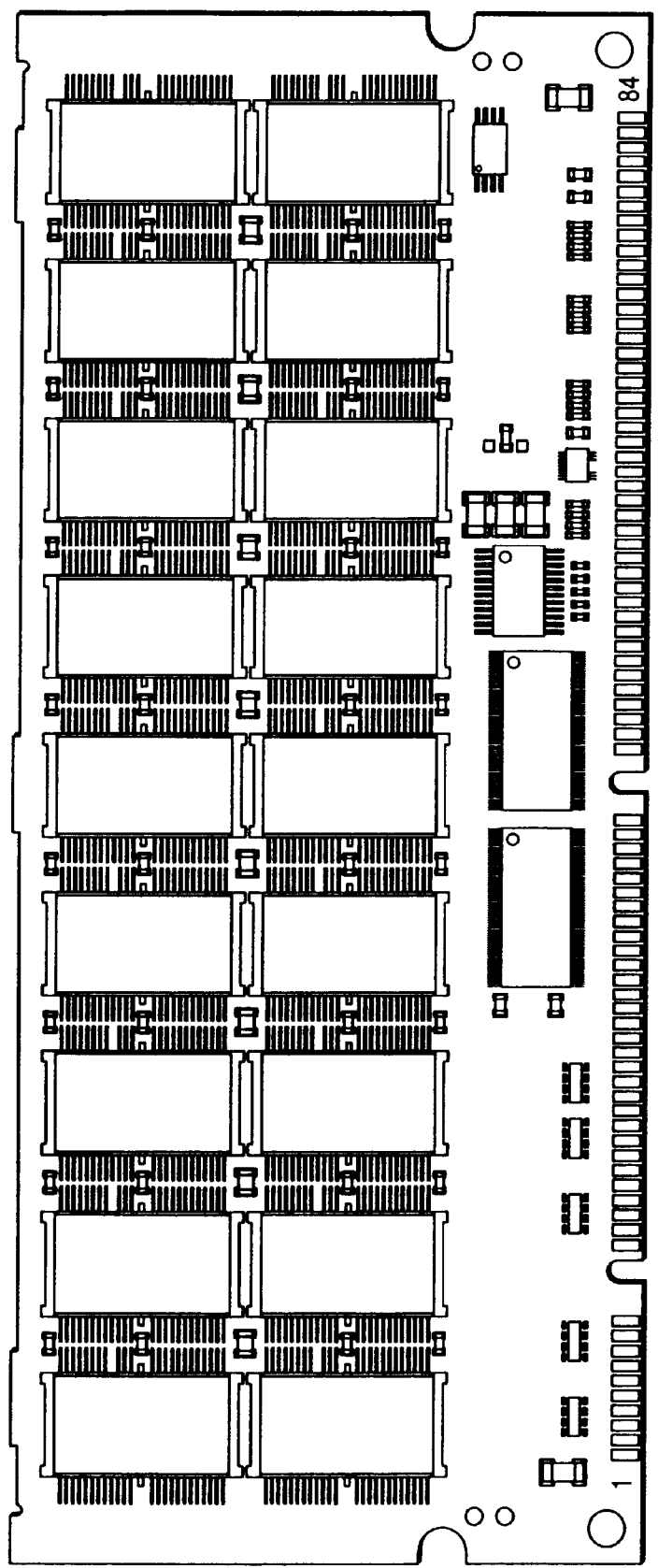
FIG. 6 is a front surface view showing an embodiment of the memory module according to this invention.
Figure 7:
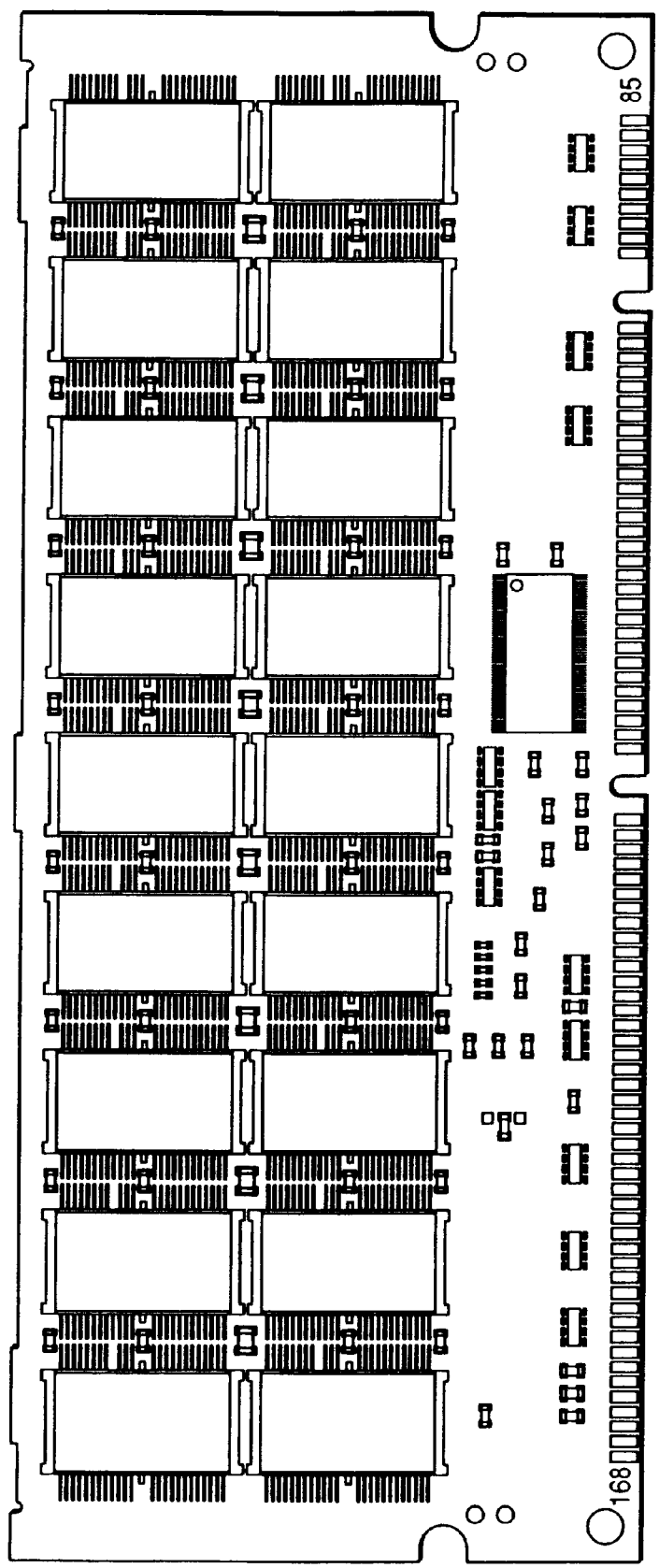
FIG. 7 is a back surface view showing an embodiment of the memory module according to this invention.

Shown in FIG. 6 is a front surface view of one embodiment of the memory module according to this invention, and shown in FIG. 7 is a back surface view of this memory module. On each of front side and back side of a module substrate, semiconductor storage devices are mounted in a matrix-shaped array such as of 9×2(=18 devices). Each of the semiconductor storage devices numbering 36 in total mounted on both surfaces of the memory module substrate, is constructed as the stacked structure of the two memory chips as shown in FIG. 1 or FIG. 5.

A register, a semiconductor integrated circuit device for signal conversion, capacitors and various resistors for a stabilized power supply, etc. are mounted between the semiconductor storage devices which are arrayed in the shape of a matrix such as of 9×2 and connectors (connecting electrodes) which are disposed on one end side of the memory module in the longitudinal direction thereof.

Figure 8:
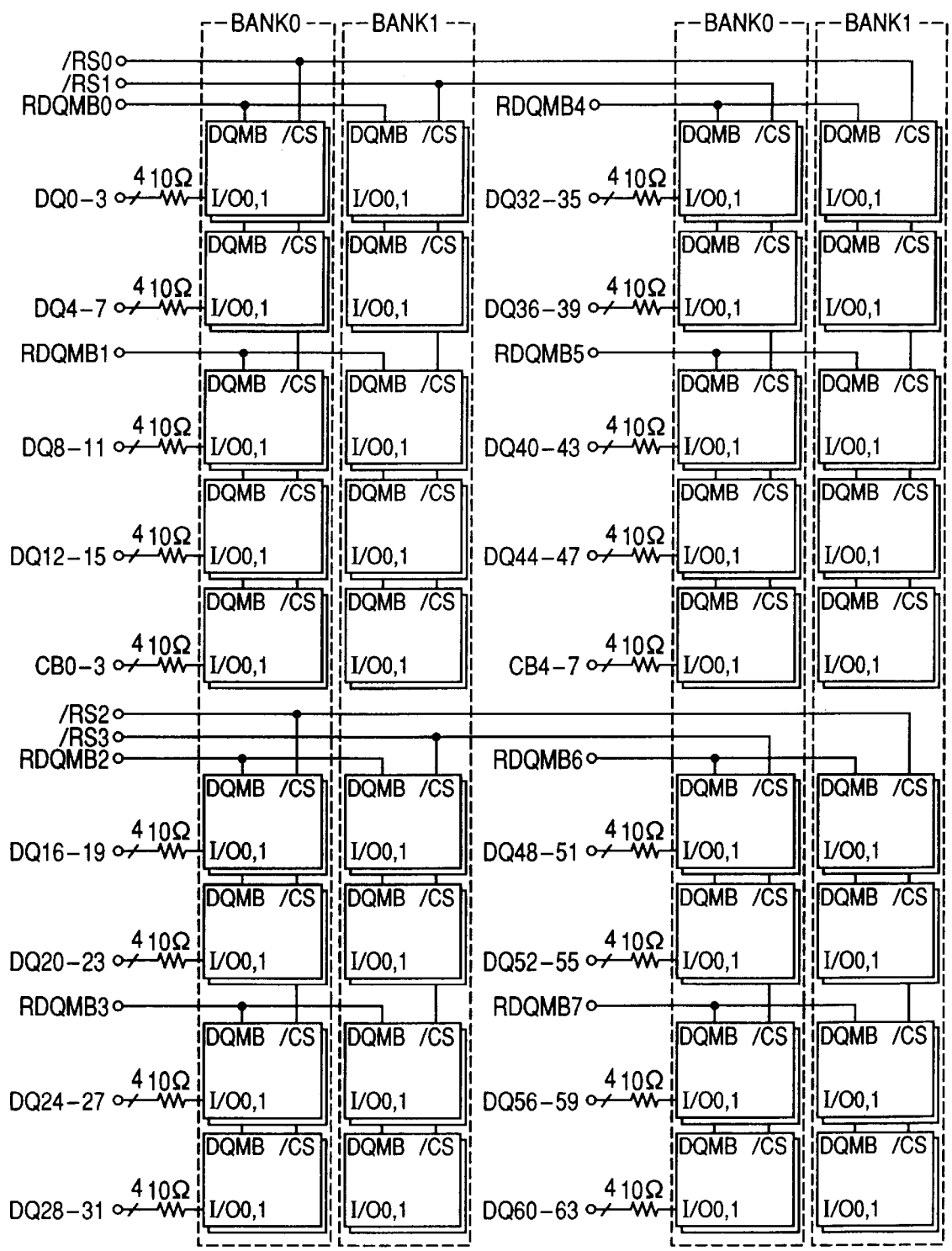
FIG. 8 is a block diagram showing an embodiment of the memory module shown in FIGS. 6 and 7.

Shown in FIG. 8 is a block diagram showing one embodiment of the memory module in FIGS. 6 and 7. The memory module of this embodiment is such that a plurality of semiconductor storage devices, in each of which memory chips of x2 bits are made into a stacked structure so as to equivalently form a x4-bit configuration, are mounted on a module substrate, thereby to construct a memory system of 64 bits. That is, a memory system is constructed in which the semiconductor storage devices are disposed on both sides with a module substrate held therebetween and which has memory banks (BANK) "0" and "1".

The memory banks "0" and "1" correspond to the nine semiconductor storage devices shown in FIGS. 6 and 7, respectively. More specifically, the nine semiconductor storage devices which take charge of the data terminals DQ0 through DQ31 and parity bits CB0 through CB3 of the memory banks "0" and "1" correspond to the 9×2 devices shown in FIG. 6, while the nine semiconductor storage devices which take charge of the data terminals DQ32 through DQ64 and parity bits CB4 through CB7 of the memory banks "0" and "1" correspond to the 9×2 devices shown in FIG. 7. In this manner, the memory module is constructed into a 64-bit configuration having the data terminals DQ0 through DQ63. The eight bits; CB0 through CB7 are provided as the parity bits. Therefore, in a mother board on which the memory module according to this embodiment is mounted, data buses to be connected to sockets into which the connectors of the memory module are plugged are brought into a 72-bit configuration.

Figure 9:
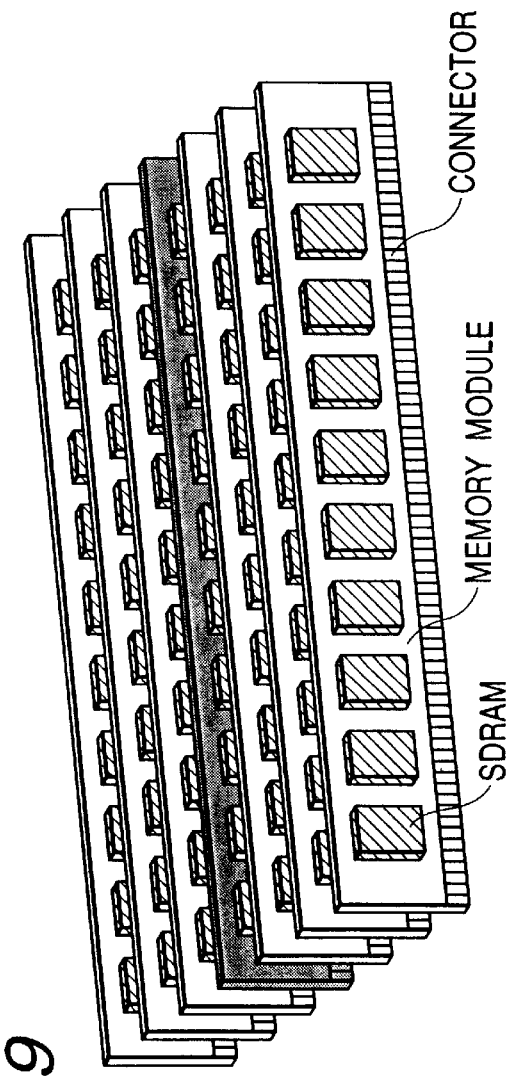
FIG. 9 is a schematic constructional view for explaining a memory system which employs memory modules according to this invention.

Shown in FIG. 9 is a schematic constructional view for explaining a memory system which employs the memory module according to this invention. The figure illustrates a situation where connectors (connecting electrodes) which are juxtaposed along one latus of each of the mounting circuit boards constituting a plurality of memory modules are arrayed in a state in which they are plugged in sockets provided on a mother board not shown. A plurality of memory modules need to be arrayed at narrow intervals in correspondence with the sockets, and it is important for this purpose that semiconductor storage devices to be mounted in the memory modules are formed thin. This embodiment indicates an example in which memory chip SDRAMs are aligned on a module substrate, unlike in the memory module of the embodiment shown in FIGS. 6 and 7.

Figure 10:
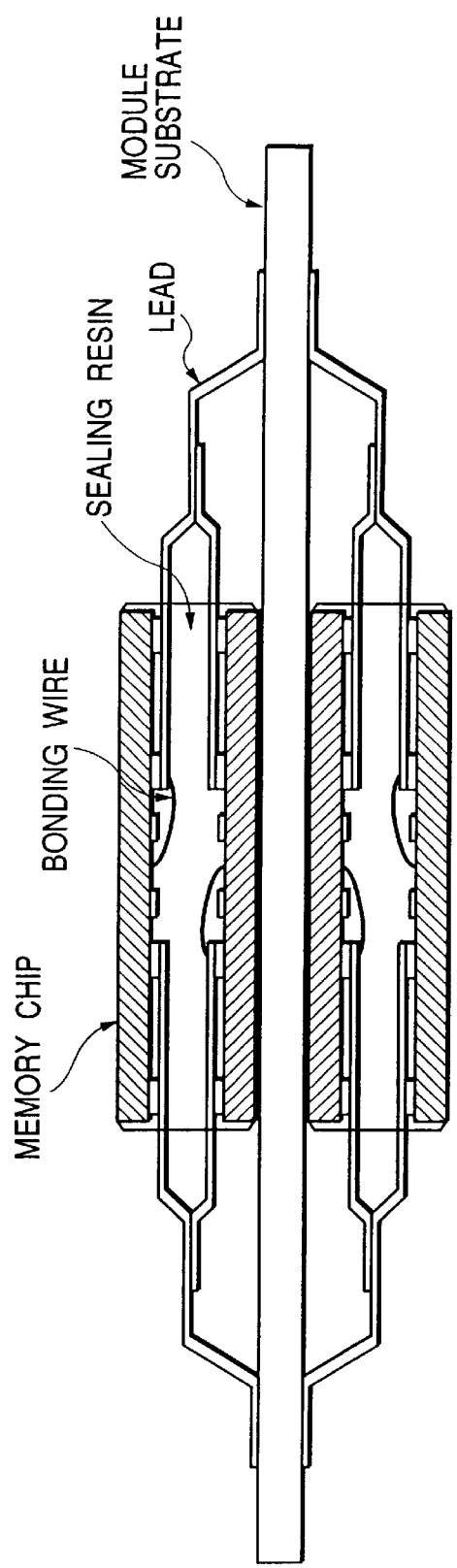
FIG. 10 is a sectional view of essential portions showing another embodiment of the memory module employing semiconductor storage devices according to this invention.

Shown in FIG. 10 is a sectional view of the essential portions of another embodiment of the memory module employing semiconductor storage devices according to this invention. In this embodiment, in order to make two memory chips into a stacked structure and to diminish the thickness of a sealing resin, the stacked structure is formed so that the back surfaces of the memory chips may face outwards, reversely to the directions thereof in the embodiment of FIG. 5. In consequence, the back surface of each memory chip is not formed with any molding resin for the purpose of sealing. This, however, does not preclude a thin sealing-resin layer from being formed on a part or all of the back surface of the memory chip in the course of the manufacture of the semiconductor storage device. In bestowing the function of sealing, the sealing resin must not be formed thick even on the back surfaces as in the prior art.

In the invention of the present application, it is not indispensable that the back surfaces of the memory chips must be held in completely exposed states in order to thin the semiconductor storage device. Insofar as the whole stacked structure of the memory chips is formed thin, the sealing resin is not precluded from being formed thin even on the back surfaces in the course of the fabrication of the stacked structure, and the back surfaces may be coated with an appropriate insulating coating material or the like. Alternatively, the back surface of each memory chip may be formed with an oxide film so as to afford an insulating property. It incurs no problem in the semiconductor storage device itself to leave the back surface of a semiconductor substrate exposed as it is. However, when the semiconductor storage device has been installed in or is assembled into an electron device, an undesirable electrical contact might occur. It is therefore desirable to make the back surface electrically insulated as stated above.

The semiconductor storage device of this embodiment has the stacked structure in the aspect in which the back surfaces of the memory chips face outwards and in which the front sides formed with circuit elements are opposite to each other. Even when the directions of the memory chips are respectively reversed to those in the embodiment of FIG. 5 configurations are all set at bond options, whereby the chips fabricated by an identical wafer pre-process are permitted to expand merely by changing the setup of some pads at the stage of assemblage. Owing to such bond options, the memory chips to be formed by the wafer pre-process can be mass-produced, and reduction in cost can be promoted.

TABLE 1

|  | BOP0B | BOP1B | BOP2B | BOP3B |
|---|---|---|---|---|
| x2 | VSS | Floating | — | — |
| x4 | Floating | Floating | — | — |
| x8 | VSS | VSS | — | — |
| x16 | Floating | VSS | — | — |
| EDO | — | — | Floating | — |
| FP | — | — | VSS | — |
| 4KR | — | — | — | Floating |
| 8KR | — | — | — | VSS |

Table 1 exemplifies the relationships between pad inputs for making the bonding options and functions in the case where the semiconductor storage device according to the invention of the present application has a storage capacity of, e. g., about 64 Mbits and where it is applied to EDO/FP products. The four sorts of bit configurations are switched using two pads BOP0B and BOP1B among four option pads, the EDO and first page (FP) are switched using one pad BOP2B, and 4K refresh (4KR) and 8K refresh (8KR) are switched using one remaining pad BOP3B.

TABLE 2

| Array of DQ pads of EDO-F: | | | | | | | | | | | | | | | | |
|---|---|---|---|---|---|---|---|---|---|---|---|---|---|---|---|---|
| x16 | 8 | 7 | 9 | 6 | 10 | 5 | 11 | 4 | 12 | 3 | 13 | 2 | 14 | 1 | 15 | 0 |
| x8 |  | 3 | 4 |  |  | 2 | 5 |  |  | 1 | 6 |  |  | 0 | 7 |  |
| x4 |  |  |  |  |  |  |  |  |  | 1 | 2 |  |  | 0 | 3 |  |
| x2 |  |  |  |  |  |  |  |  |  |  | 0 |  |  |  | 1 |  | in this manner, the semiconductor storage device can be, in effect, thinned as in the embodiment of FIG. 5 for the reason that the sealing resin on the back surfaces can be dispensed with.

Figure 11:
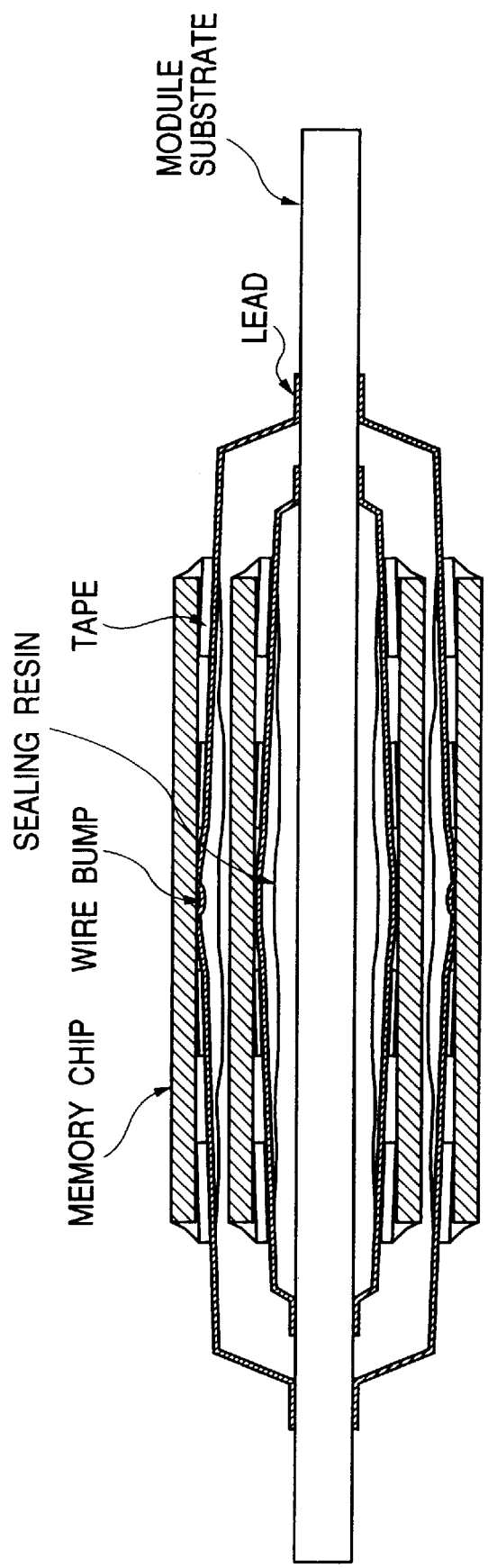
FIG. 11 is a sectional view of essential portions showing another embodiment of the memory module employing semiconductor storage devices according to this invention.

Shown in FIG. 11 is a sectional view of the essential portions of another embodiment of the semiconductor storage device according to this invention. In the semiconductor storage device of this embodiment, leads are printed on a tape (a flexible substrate), the tape is stuck on the front surface of each memory chip, and the leads are connected to bonding pads by wire bumps. Although no special restriction is intended, a sealing resin is deposited extending from the front surface of each memory chip to the side surfaces thereof, and the back surface of each memory chip is substantially exposed without being sealed with a resin, in the sense as explained in conjunction with FIG. 10, whereby the whole semiconductor storage device is formed thin. Therefore, two such semiconductor storage devices are made into a stacked structure on a module substrate as they are held independent.

As thus far described, in the semiconductor storage device according to the present invention, the x2 configuration is added in the memory chip, thereby to realize the bit configurations of x4 bits etc. in the stacked products. Furthermore, in the present invention, the x2, x4, x8 and x16

Table 2 shows the relationships of the roles of DQ pins. In order to support, at most, x16 bits, the memory module includes the DQ pins in the number of 16. The pins which are not used increase in number in the order of the x8, x4 and x2 configurations, and they may be made "open" in these cases. The pins DQ1, DQ3, DQ13 and DQ15 are employed in the x4 configuration, and are also employed for the input/output pins of a parallel test which uses four DQ pins. The pin DQ15 is used in all cases. That is, it is used in both the x2-bit configuration and an EIAJ test.

Referring to Table 1, among the option pads, also the two BOP0B, BOP1B and, if necessary, the two BOP2B, BOP3B may be connected to external terminals. In this case, when the external terminals have been mounted in the memory module, voltages as indicated in Table 1 are fed to these external terminals, whereby the bit configurations can be set as in the foregoing. Thus, when a user mounts the external terminals in the memory module, he/she can select the bit configuration of the data terminals.

Figure 12:
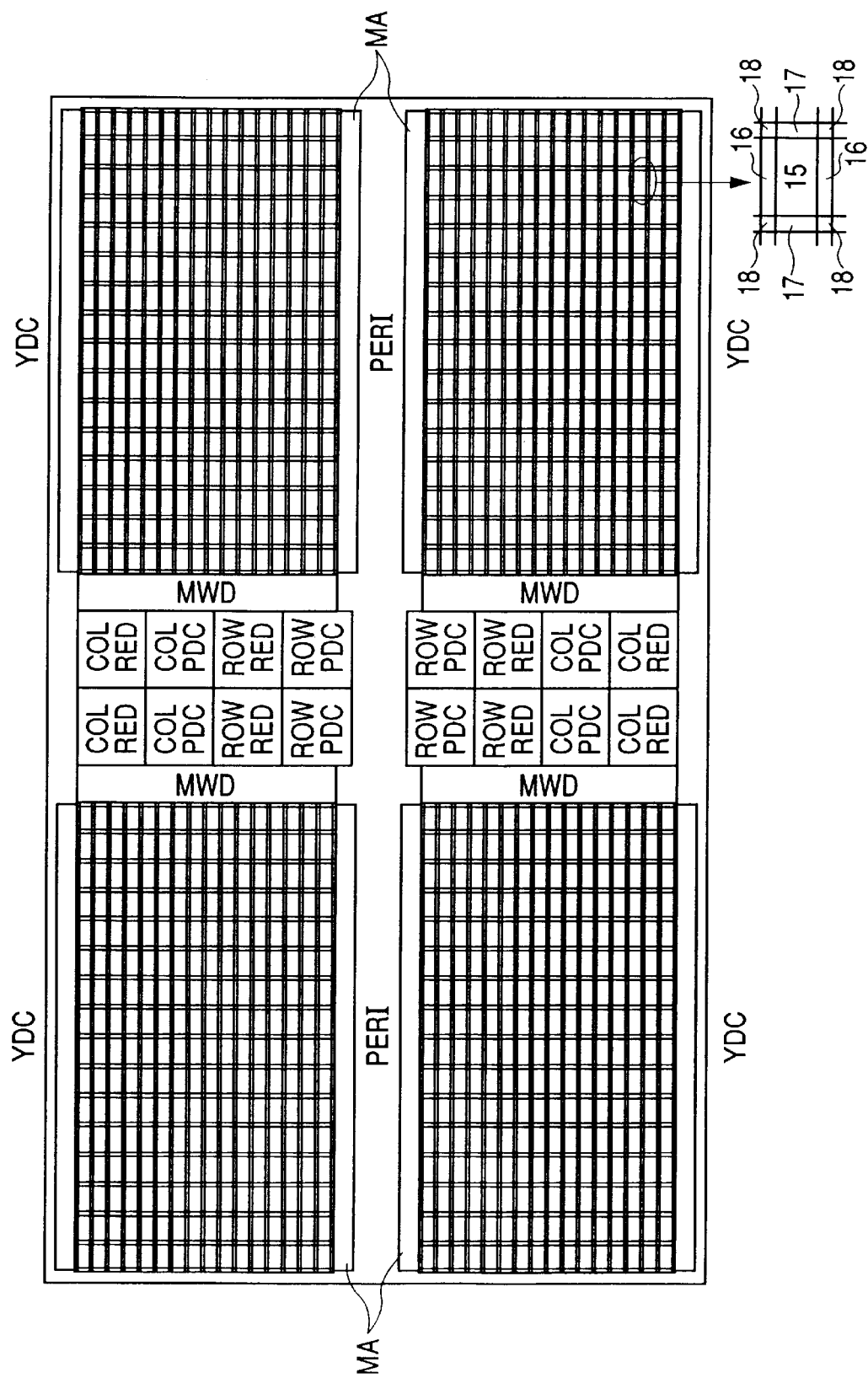
FIG. 12 is a schematic layout diagram showing an embodiment of a dynamic RAM to which this invention is applied.

Shown in FIG. 12 is a schematic layout diagram of one embodiment of a dynamic RAM to which this invention is applied. Individual circuit blocks in the figure are formed on a single semiconductor substrate, such as of single-crystal silicon, by known techniques for manufacturing semiconductor integrated circuits. Individual circuits in the figure are depicted substantially in agreement with the geometrical arrangement thereof on the semiconductor substrate. In this embodiment, memory arrays are separated into four as a whole, thereby to construct memory banks "0" through "3".

The memory banks "0" through "3" correspond to the memory arrays which are separated in two vertically and in two laterally in the longitudinal direction of a semiconductor chip. A peripheral circuit PERI which includes an address input circuit, a data input/output circuit and a bonding pad array, is disposed at the central part of the chip extending in the longitudinal direction thereof.

Although not shown, an example of the peripheral circuit PERI includes a step-up voltage generator circuit and a control circuit for controlling the operation thereof, a voltage divider circuit in the case of an interface of SSTL as divides an external power supply voltage VDDQ into 1/2 and thus forms the reference voltage of an input circuit constructed of a differential circuit, an input/output circuit and a clock control circuit therefor, a Y predecoder and a read/write buffer, a step-down circuit for forming the operating voltage of a peripheral circuit, a VPP sensor for detecting whether or not a voltage VPP has a desired value, an X address latch circuit, a Y clock circuit, a mode decoder/clock buffer and a command circuit, a Y counter and a control circuit therefor, a refresh control circuit, a bonding option circuit, a power supply turn-ON detector circuit, etc.

Regarding each of the memory arrays totaling four; two separated vertically and two separated laterally in the longitudinal direction of the semiconductor chip as stated above, an X-coordinate predecoder circuit ROWPDC and remedy circuit ROWRED and a Y-coordinate predecoder circuit COLPDC and remedy circuit COLRED are collectively arranged at the lateral middle part of the semiconductor chip in the longitudinal direction thereof. That is, two sets each consisting of the X-coordinate predecoder circuit ROWPDC and remedy circuit ROWRED and the Y-coordinate predecoder circuit COLPDC and remedy circuit COLRED are distributed in correspondence with the two left and right memory arrays among the four memory arrays.

Main word driver areas MWD are formed at the intermediate part of the memory arrays likewise to the above, and they drive main word lines laid extending downwards and upwards in correspondence with the corresponding memory arrays, respectively. With this construction, in the case of employing the same subarrays as in the foregoing, the main word lines are extended so as to penetrate through 16 subarrays. Although no special restriction is intended, Y decoders YDC are disposed on the peripheral sides of the chip remote from the central part thereof in the memory arrays. That is, the memory arrays separated in four are so arranged as to be held between main amplifiers MA located on the central side and the Y decoders YDC located on the peripheral sides, respectively. The four memory arrays correspond to the four memory banks.

As described above, one memory array corresponding to the memory bank has the 16 subarrays in the direction of the word lines, and the two pairs of main input/output lines from each of the subarrays are extended in the direction of bit lines between the subarrays, thereby to be led to the input terminals of the 32 main amplifiers MA as stated before. Thus, the bit configurations of x2, x4, x8 and x16 as explained before can be switched.

In this embodiment, the memory arrays separated in four are so arranged as to be held between the main amplifiers MA located on the central side and the Y decoders YDC located on the peripheral sides, respectively. As one of the memory arrays is shown on an enlarged scale, each memory array is divided into a plurality of subarrays 15. Each of such subarrays 15 is so formed as to be surrounded with sense amplifier areas 16 and sub word driver areas 17 which are respectively located holding the subarray 15 therebetween. The intersection parts between the sense amplifier areas 16 and the sub word driver areas 17 are determined as cross areas 18. Sense amplifiers to be provided in the sense amplifier areas 16 are constructed in conformity with a shared sense scheme. Except for the sense amplifiers which are arranged at both ends of each memory cell array, complementary bit lines are laid at the right and left of the sense amplifiers and are selectively connected to either of the right and left complementary bit lines of the memory cell array.

Each of the subarrays 15 includes sub word lines in the number of, for example, 256 and 256 pairs of complementary bit lines (or data lines) being orthogonal to the sub word lines, though not shown. Incidentally, the subarray is also provided with spare word lines and spare complementary bit lines in order to remedy defective word lines and defective bit lines, respectively. In each of the memory arrays, the subarrays are disposed in the number of 16 in the direction of arraying the word lines, so that the sub word lines are laid for about 4 kbits as a whole, while the subarrays are disposed in the number of 16 in the direction of arraying the bit lines, so that the complementary bit lines are laid for about 4 kbits as a whole. Such memory arrays are disposed in the number of four as a whole, so that the semiconductor storage device has the storage capacity of, e. g., 4×4 k×4 k=64 Mbits as a whole.

As another example, each of the subarrays 15 may well include sub word lines in the number of, for example, 512 and 512 pairs of complementary bit lines (or data lines) being orthogonal to the sub word lines, though not shown. Likewise to the above, the subarray is also provided with spare word lines and spare complementary bit lines in order to remedy defective word lines and defective bit lines, respectively. In each of the memory arrays, the subarrays are disposed in the number of 16 in the direction of arraying the word lines, so that the sub word lines are laid for about 8 kbits as a whole, while the subarrays are disposed in the number of 16 in the direction of arraying the bit lines, so that the complementary bit lines are laid for about 8 kbits as a whole. Such memory arrays are disposed in the number of four as a whole, so that the semiconductor storage device has a storage capacity of, e. g., 8×8 k×4 k=256 Mbits as a whole.

By adopting the hierarchical word line scheme as explained above, the lengths of the complementary bit lines are divided into 1/16 in correspondence with the 16 subarrays in any of the above cases. The lengths of the sub word lines are divided into 1/16 in correspondence with the 16 subarrays. The sub word driver (sub word line driving circuit) 17 is provided every divided subarray 15 of each of the memory arrays. The sub word driver 17 forms a selection signal for the sub word line which is divided to the length of 1/16 relative to the main word line as stated above, and which is extended in parallel with the main word line.

In this embodiment, for the purpose of decreasing the number of the main word lines, in other words, for the purpose of moderating the wiring pitch of the main word lines, the sub word lines in the number of four are laid in the direction of the complementary bit lines in correspondence with one main word line though not especially restricted. A sub word selection driver, not shown, is arranged in the main word driver MWD in order to select one sub word line from among the sub word lines which are divided into eight in the direction of the main word line and which are allotted in the direction of the complementary bit lines in the number of four, as stated above. The sub word selection driver forms a selection signal for selecting one of four sub word selection lines which are extended in the direction of arraying the sub word drivers.

In the case of adopting the layout as shown in FIG. 12, when a Y address is inputted, it is passed through an address buffer ADDBUP and is conveyed to the Y decoder YDC which is located on the peripheral edge side of the chip through the remedy circuit and the predecoder disposed at the middle part of the memory arrays, and in which a Y selection signal is formed. The complementary bit lines of one subarray is selected by the Y selection signal, and the difference of the potentials of the complementary bit lines is conveyed to the main amplifier MA located on the central side of the chip remote from the peripheral edge side thereof and is amplified therein, whereupon the amplified signal is outputted through an output circuit not shown.

At a glance, this construction is so judged that the difference signal will circumvent the chip to lengthen a time period expended till the outputting of the read signal. However, the address signal needs to be inputted to the remedy circuit as it is. Therefore, when the remedy circuit is located anywhere at the central part of the chip, the outputting time point of the predecoder is determined after waiting for the result of decision on whether or not the inputted address is defective. That is, when the predecoder and the remedy circuit are distant, a signal delay involved therein forms a cause for retarding the actual Y selection operation.

In this embodiment, the main amplifier MA and the Y decoder YDC are arranged on both sides of the memory array. Therefore, the sum between a signal transmission path for selecting the complementary bit lines of the subarray and a signal transmission path extending from the selected complementary bit lines to the input end of the main amplifier MA through the input/output lines becomes a signal transmission path merely for traversing the memory array whichever complementary bit lines are selected, and this signal transmission path can be shortened to half of a signal transmission path for one reciprocation as stated above. Thus, it is permitted to quicken memory accesses.

In the case where the four memory arrays are respectively held in correspondence with the memory banks as explained above, the positions of the memory arrays which are simultaneously operated in the two memory chips are made different, in the structure in which the two memory chips are stacked back to back as in the embodiment of FIG. 5. That is, two of the memory arrays are selected while holding therebetween the peripheral circuit PERI which is provided at the vertical central part of the memory chip. Thus, places to generate heat can be dispersed.

Figure 13:
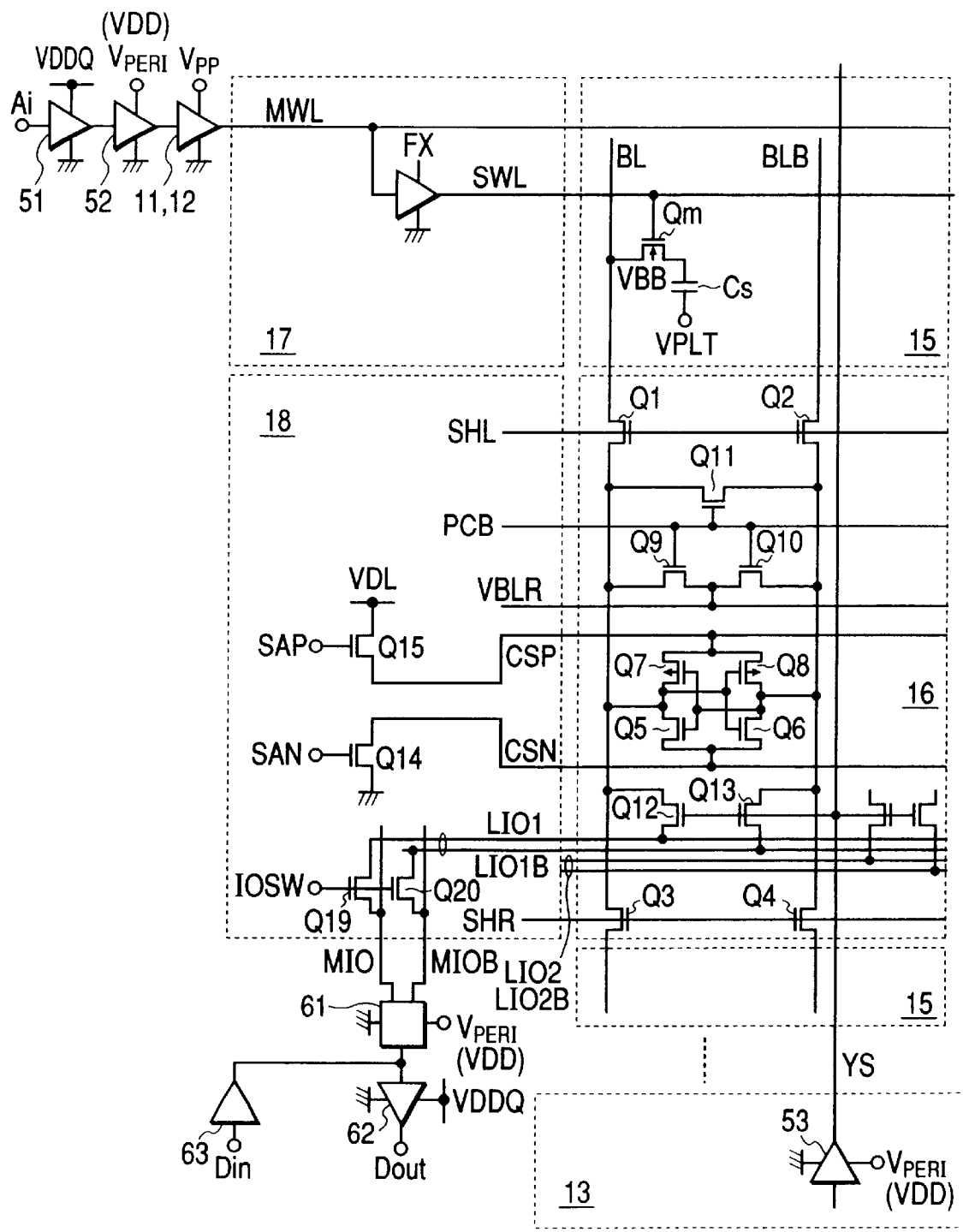
FIG. 13 is a circuit diagram showing an embodiment of a dynamic RAM according to this invention.

Shown in FIG. 13 is a circuit diagram of one simplified embodiment from address inputting to data outputting as centers round the sense amplifier portion of a dynamic RAM according to this invention. In the figure, a sense amplifier 16 vertically held between two subarrays 15, and circuits disposed in a cross area 18 are exemplified, and the others are shown in blocks.

A dynamic memory cell is representatively exemplified by one which is provided between a sub word line SWL laid in one of the subarrays 15 and one bit line BL of complementary bit lines BL, BLB. The dynamic memory cell includes an address selecting MOSFET Qm and a storage capacitor Cs. The gate of the address selecting MOSFET Qm is connected to the sub word line SWL, the drain of this MOSFET Qm is connected to the bit line BL, and the source thereof has the storage capacitor Cs connected thereto. The electrodes of such storage capacitors Cs remote from the sources of the MOSFETs Qm are made common, and are fed with a plate voltage VPLT. A back bias voltage VBB being minus is applied to the substrate (channels) of the MOSFETs Qm. Although not especially restricted, the back bias voltage VBB is set at a voltage of, e. g., −1 V. The selection level of the sub word line SWL is set at a high voltage VPP which is higher than the high level of the bit line by the threshold voltage of the address selecting MOSFET Qm.

In the case where the sense amplifier is operated by an internal voltage drop VDL, the high level which is obtained by the amplification of the sense amplifier and which is applied to the bit line is set at the level of the internal voltage drop VDL. Accordingly, the high voltage VPP which corresponds to the selection level of the word line becomes VDL+Vth+α. One pair of complementary bit lines BL and BLB of the subarray laid on the left side of the sense amplifier are arranged in parallel as shown in the figure. Such complementary bit lines BL and BLB are respectively connected with the input/output nodes of the unit circuit of the sense amplifiers by shared switch MOSFETs Q1 and Q2.

The unit circuit of the sense amplifiers includes a CMOS latch circuit configured of amplifying MOSFETs Q5, Q6 of N-channel type and amplifying MOSFETs Q7, Q8 of P-channel type, the gates and drains are cross-connected into latch forms. The sources of the N-channel type MOSFETs Q5 and Q6 are connected to a common source line CSN. The sources of the P-channel type MOSFETs Q7 and Q8 are connected to a common source line CSP. Power switch MOSFETs are respectively connected to the common source lines CSN and CSP.

Although no especial restriction is intended, an operating voltage correspondent to the ground potential is applied to the common source line CSN to which the sources of the amplifying MOSFETs Q5 and Q6 of N-channel type are connected, by the power switch MOSFET Q14 of N-channel type which is provided in the cross area 18 though not especially restricted. Likewise, the common source line CSP to which the sources of the amplifying MOSFETs Q7 and Q8 of P-channel type are connected is provided with the power MOSFET Q15 of N-channel type which feeds the internal voltage VDL. The power switch MOSFETs may be dispersedly disposed in the respective unit circuits.

Activation signals SAN and SAP for the sense amplifier, which are fed to the gates of the power MOSFETs Q14 and Q15 of N-channel type, are in phase signals which are brought to high levels in activating the sense amplifier. The high level of the signal SAP is set at the level of the stepped-up voltage VPP. Since the stepped-up voltage VPP is brought to about 3.6 V for the voltage VDL of 1.8 V, it can hold the common source line CSP at the level of the internal voltage VDL while satisfactorily keeping the N-channel type MOSFET Q15 in its ON state.

Provided at the input/output nodes of the unit circuit of the sense amplifiers is a precharging (equalizing) circuit which includes an equalizing MOSFET Q11 for short-circuiting the complementary bit lines, and switch MOSFETs Q9 and Q10 for feeding a half precharge voltage VBLR to the complementary bit lines. The gates of the MOSFETs Q9 through Q11 are fed with a precharge signal PCB in common. Although not shown, a driver circuit for forming the precharge signal PCB is such that an inverter circuit is provided in the cross area so as to quicken the rise and fall of the precharge signal. That is, in starting memory accesses, the MOSFETs Q9 through Q11 constituting the precharging circuits are switched at high speed through the inverter circuits dispersedly disposed in the respective cross areas, preceding the selection timing of a word line.

An IO switch circuit IOSW (switch MOSFETs Q19, Q20 for connecting local IO and main IO) is located in the cross area 18. Further, a half precharge circuit for the common source lines CSP and CSN of the sense amplifier, a half precharge circuit for local input/output lines LIO, a VDL precharge circuit for main input/output lines, dispersed driver circuits for shared selection signal lines SHR and SHL, etc. are disposed in addition to the circuits shown in FIG. 3 as required.

The unit circuit of the sense amplifiers is connected to the similar complementary bit lines BL, BLB of the subarray 15 on the lower side of the drawing, through shared switch MOSFETs Q3 and Q4. For example, when the sub word line SWL of the upper subarray is selected, the upper shared switch MOSFET Q1 and Q2 of the sense amplifier are brought into ON states, and the lower shared switch MOSFET Q3 and Q4 are brought into OFF states. Switch MOSFETs Q12 and Q13 constitute a column (Y) switch circuit. When the selection signal YS is set at the selection level (high level), the switch MOSFETs Q12 and Q13 are brought into ON states, thereby to connect the input/output nodes of the unit circuit of the sense amplifiers with the local input/output lines LIO1, LIO1B, LIO2, LIO2B, etc.

Thus, the input/output nodes of the sense amplifier are connected to the upper complementary bit lines BL, BLB, the minute signal of the memory cell connected to the selected sub word line SWL is amplified, and the amplified signal is conveyed to the local input/output lines LIO1, LIO1B through the column switch circuit (Q12 and Q13). The local input/output lines LIO1, LIO1B are extended along the array of the sense amplifiers, that is, in the lateral direction in the figure. The local input/output lines LIO1, LIO1B are connected to the main input/output lines MIO, MIOB to which the input terminals of a main amplifier 61 are respectively connected, through the IO switch circuit which includes the N-channel type MOSFETs Q19 and Q20 and which is provided in the cross area 18.

The IO switch circuit is switch-controlled by a selection signal which is formed by decoding an address signal of X coordinates. Incidentally, the IO switch circuit may have a CMOS switch construction in which P-channel type MOSFETs are connected in parallel with the N-channel type MOSFETs Q19 and Q20, respectively. In the burst mode of a synchronous DRAM, the column selection signal YS is switched by a counter operation, and the connections between the local input/output lines LIO1, LIO1B and LIO2, LIO2B and every two pairs of the complementary bit lines BL, BLB of the subarray are switched in succession.

An address signal Ai is fed to an address buffer 51. This address buffer operates in time-division fashion so as to accept an X address signal and a Y address signal. The X address signal is fed to a predecoder 52, and a selection signal for a main word line MWL is formed through a main row decoder 11 and a main word driver 12. The address buffer 51 receives the address signal Ai fed from an external terminal and is operated by a power supply voltage VDDQ fed from an external terminal, the predecoder is operated by a stepped-down voltage VPERI (VDD) obtained by lowering the power supply voltage, and the main word driver 12 is operated by the stepped-up voltage VPP. A logic circuit with a level conversion facility, which receives the predecoded signal, is employed as the main word driver 12. A column decoder (driver) 53 includes a driver circuit whose operating voltage is formed by a MOSFET Q23 constituting the VCLP generator circuit, and it forms the selection signal YS upon receiving the Y address signal which is fed by the time-divisional operation of the address buffer 51.

The main amplifier 61 is operated by the stepped-down voltage VPERI (VDD), and it delivers an output from an external terminal Dout through an output buffer 62 which is operated by the power supply voltage VDDQ fed from the external terminal. A write signal received from an external terminal Din is accepted through an input buffer 63, and it is fed to the main input/output lines MIO and MIOB through a write amplifier (write driver) which is included in the main amplifier 61 in the figure. The input portion of the output buffer 62 is provided with a level conversion circuit, and a logic portion for delivering the output signal of the level conversion circuit in synchronism with a timing signal correspondent to the clock signal.

Although no special restriction is intended, the power supply voltage VDDQ which is fed from the external terminal is set at 3.3 V in a first aspect, the stepped-down voltage VPERI (VDD) which is fed to the internal circuits is set at 2.5 V, and the operating voltage VDL of the sense amplifier is set at 1.8 V. Besides, the selection signal (stepped-up voltage) of the word line is set at 3.6 V. The precharge voltage VBLR of the bit line is set at 0.9 V corresponding to VDL/2, and the plate voltage VPLT is also set at 0.9 V. In addition, the substrate voltage VBB is set at −1.0 V. The power supply voltage VDDQ which is fed from the external terminal, may be set at a low voltage of, e. g., 2.5 V in a second aspect. In the case of such a low power supply voltage VDDQ, the stepped-down voltage VPERI (VDD) and the stepped-down voltage VDL may be equally set at about 1.8 V.

Alternatively, it is allowed that the power supply voltage VDDQ which is fed from the external terminal is set at 3.3 V, and that the stepped-down voltage VPERI (VDD) which is fed to the internal circuits, and the operating voltage VDD of the sense amplifier are equally set at 2.0 V or 1.8 V. In this manner, the internal voltages can adopt various aspects of performance relative to the external power supply voltage VDDQ.

Figure 14:
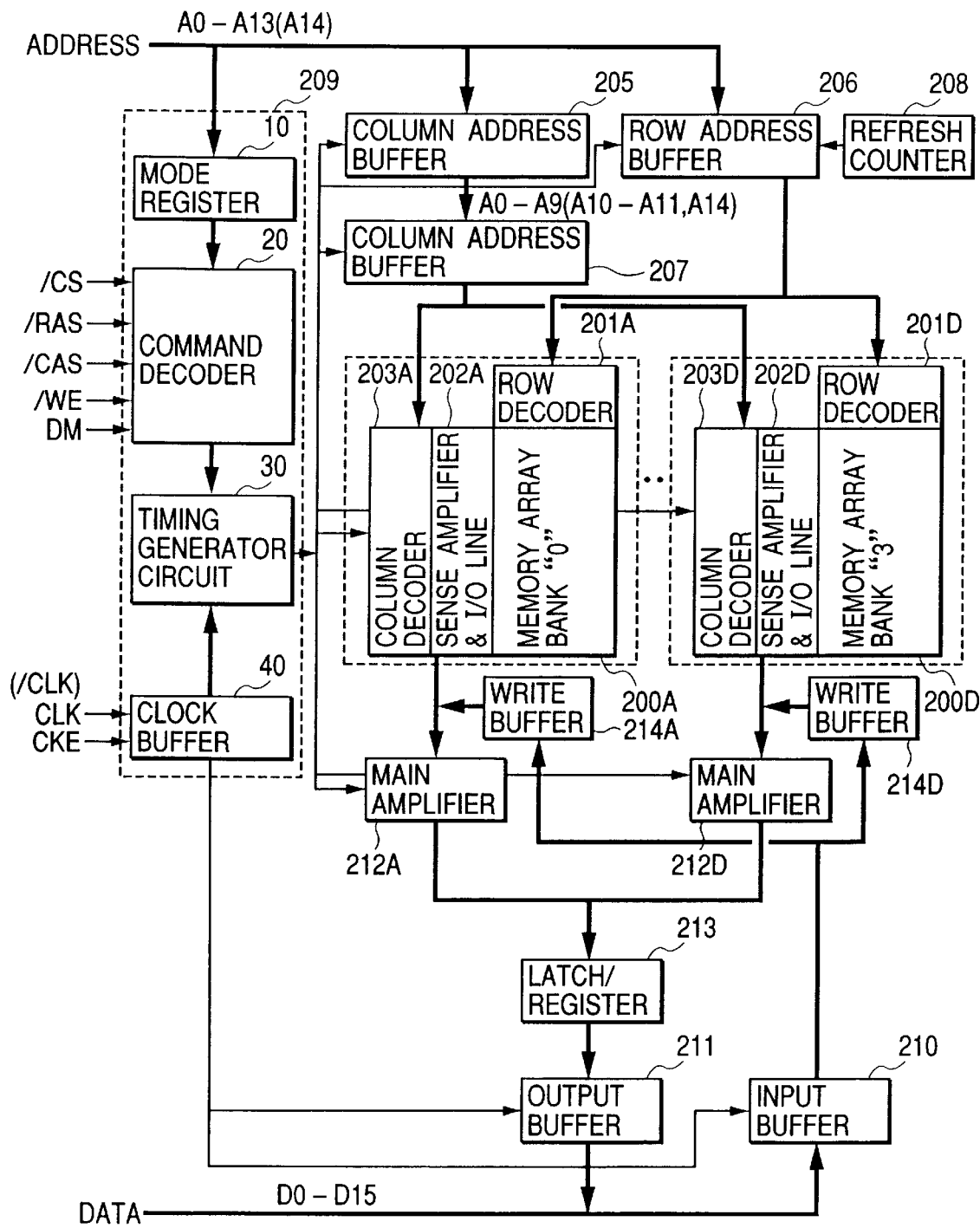
FIG. 14 is a whole block diagram showing an embodiment of a synchronous DRAM to which this invention is applied.

Shown in FIG. 14 is a whole block diagram of one embodiment of a synchronous DRAM (hereinbelow, simply termed "SDRAM") of about 256 Mbits to which this invention is applied. In the SDRAM of this embodiment, among four memory banks, a memory array 200A constructing the memory bank "0" and a memory array 200D constructing the memory bank "3" are exemplified though no special restriction is made.

That is, memory arrays 200B and 200C corresponding to two memory banks "1" and "2" among the four memory banks are omitted. Each of the memory arrays 200A through 200D held in correspondence with the four memory banks "0" through "3", respectively, includes dynamic memory cells which are arranged in the shape of a matrix as in the memory arrays 200A and 200D exemplified in the figure. According to the illustration, the selection terminals of the memory cells arranged in an identical column are coupled to a word line (not shown) every column, and the data input/output terminals of the memory cells arranged in a identical row are coupled to complementary data lines (not shown) every row.

One of the unshown word lines of the memory array 200A is driven to a selection level in accordance with the decoded result of a row address signal by a row decoder 201A. The unshown complementary data lines of the memory array 200A are coupled to an I/O line 202A which includes a sense amplifier and a column selector circuit. The sense amplifier in the I/O line 202A which includes the sense amplifier and the column selector circuit, is an amplifier circuit for detecting and amplifying a minute potential difference which appears between the corresponding complementary data lines by reading data out of the memory cell. The column switch circuit in the I/O line 202A is a switch circuit for selecting the individual pairs of complementary data lines and conducting them to complementary I/O lines. The column switch circuit performs the selection operation in accordance with the decoded result of a column address signal by a column decoder 203A.

Each of the memory arrays 200B through 200D is similarly provided with a row decoder 201D, an I/O line 202D which includes a sense amplifier and a column selector circuit, and a column decoder 203D, as exemplified in the memory array 200D. The complementary I/O lines are connected to the output terminals of write buffers 214A, B and the input terminals of main amplifiers 212A, D. The output signal of the main amplifiers 212A, D is conveyed to the input terminal of a latch/register 213, the output signal of which is outputted from an external terminal through an output buffer 211.

A write signal inputted from an external terminal is conveyed to the input terminal of the write buffer 214A, D through an input buffer 210. Although not especially restricted, the external terminal is made a data input/output terminal which delivers data D0–D15 composed of 16 bits. Main amplifiers and write buffers similar to the above are respectively disposed in correspondence with the omitted memory arrays 200B and C.

Address signals A0 through A13 fed from address input terminals are accepted in an address multiplexing form by a column address buffer 205 and a row address buffer 206. In the case where the SDRAM has a storage capacity of, e. g., 256 Mbits and where memory accesses are made in 2-bit units as explained before, an address terminal for inputting an address signal A14 is provided. The address signals up to A11 are validated in the x4-bit configuration, the address signals up to A10 are validated in the x8-bit configuration, and the address signals up to A9 are validated in the x16-bit configuration. In the case of a storage capacity of, e. g., 64 Mbits, the address signals up to A10 are validated in the x4-bit configuration, the address signals up to A9 are validated in the x8-bit configuration, and the address signals up to A8 are validated in the x16-bit configuration as shown in the figure.

The address signals fed from the address input terminals are held in the respectively corresponding buffers. The row address buffer 206 accepts a refresh address signal outputted from a refresh counter 208, as the row address signal in a refresh operation mode. The output of the column address buffer 205 is fed as the preset data of a column address counter 207, which outputs the column address signal being the preset data or values obtained by incrementing the column address signal in succession, toward the column decoders 203A through 203D in accordance with an operation mode designated by commands to be explained later.

Although not especially restricted, a controller 209 indicated by a broken line in the figure is fed with external control signals such as a clock signal CLK, a clock enable signal CKE, a chip select signal /CS, a column address strobe signal /CAS (symbol "/" signifies that a signal bearing this symbol is a low enable signal), a row address strobe signal /RAS and a write enable signal /WE; and control data from the address input terminals A0 through A11; and it forms internal timing signals for controlling the operation mode of the SDRAM and the operations of the circuit blocks on the basis of the level changes and timings of the signals, etc. It includes a mode register 10, a command decoder 20, a timing generator circuit 30 and a clock buffer 40, etc.

The clock signal CLK is inputted through the clock buffer 40 to the clock synchronizer circuit 50 as explained before, whereby an internal clock is generated. Although not especially restricted, the internal clock is employed as a timing signal for activating the output buffer 211 and the input buffer 210, and it is also fed to the timing generator circuit 30, in which a timing signal to be fed to the column address buffer 205, row address buffer 206 and column address counter 207 is formed on the basis of such a clock signal.

The other external input signals are asserted in synchronism with the rising edge of the internal clock signal. The chip select signal /CS commands the start of a command input cycle by its low level. When the chip select signal /CS is at its high level (in the non-selected state of the chip), any other input is insignificant. However, the selected state of a memory bank and the internal operations of a burst operation etc. as will be explained later are not affected by the change of the SDRAM into the chip non-selection state. The signals /RAS, /CAS and /WE differ in functions from respectively corresponding signals in an ordinary DRAM, and they are asserted when a command cycle to be explained later is defined.

The clock enable signal CKE is a signal for commanding the validity of the next pulse of the clock signal. The rising edge of the next pulse of the clock signal CLK is validated for the high level of the signal CKE, and is invalidated for the low level thereof. By the way, in the case of providing an external control signal /OE which performs an output enabling control for the output buffer 211 in a read mode, such a signal /OE is also fed to the controller 209, and the output buffer 211 is brought into a high output impedance state when the signal is at a high level by way of example.

The row address signal is defined by the levels of the signals A0 through A11 in a row address strobe/bank active command cycle to be explained later, which is synchronized with the rising edge of the clock signal CLK (internal clock signal).

The address signals A12 and A13 are regarded as a bank selection signal in the row address strobe/bank active command cycle. That is, one of the four memory banks "0" through "3" is selected by the combination of the signals A12 and A13. Although not especially restricted, a control for selecting the memory bank can be performed by such a processing as activating only the row decoder on the selected memory bank side, turning OFF all the column switch circuits on the non-selected memory bank sides, or connecting only the selected memory bank side to the input buffer 210 and output buffer 211.

In the case of the storage capacity of 256 Mbits and the x16-bit configuration as stated before, the column address signal is defined by the levels of the signals A0 through A9 in a read or write command (column address read command or column address write command to be explained later) cycle, which is synchronized with the rising edge of the clock signal CLK (internal clock signal). Besides, a column address thus defined is used as the start address of a burst access.

There will now be explained the main operation modes of the SDRAM instructed by commands:

(1) Mode Register Set Command (Mo)

This is a command for setting the mode register 30. This command is designated by the signals CS, /RAS, /CAS, /WE=low levels, and data to be set (register set data) are given through the terminals A0 through A11. Although not especially restricted, the register set data contain a burst length, a CAS latency, a write mode, etc. Although not especially restricted, settable burst lengths are "1", "2", "4", "8" and "full page"; settable CAS latency values are "1", "2" and "3"; and settable write modes are "burst write" and "single write".

The CAS latency indicates that number of cycles of the internal clock signal which are expended on a time period since the fall of the signal /CAS till the output operation of the output buffer 211, in a read operation which is instructed by the column address read command to be explained later. An internal operation time period for reading data is required before the settlement of read data, and it is set by this command in accordance with the working frequency of the internal clock signal. In other words, the CAS latency is set at a relatively large value in the case of employing an internal clock signal of high frequency, whereas the CAS latency is set at a relatively small value in the case of employing an internal clock signal of low frequency.

(2) Row Address Strobe/Bank Active Command (Ac)

This is a command which validates the instruction of row address strobe and the selection of a memory bank based on the signals A12 and A13, and which is designated by the signals /CS, /RAS=low levels and the signals /CAS, /WE=high levels. On this occasion, an address fed to the terminals A0 through A9 are accepted as a row address signal, while signals fed to the terminals A12 and A13 are accepted as a selection signal for the memory bank. The accepting operation is done in synchronism with the rising edge of the internal clock signal as stated above. For example, when the command is designated, a word line in the memory bank instructed by this command is selected, and memory cells connected to the word line are respectively conducted to corresponding complementary data lines.

(3) Column Address Read Command (Re)

This command is one which is necessary for starting a burst read operation and which gives the instruction of column address strobe, and it is designated by the signals /CS, /CAS=low levels and the signals /RAS, /WE=high levels. On this occasion, a column address fed to the terminals A0 through A9 (in the case of the x16-bit configuration) are accepted as a column address signal. The column address signal thus accepted is fed to the column address counter 207 as a burst start address.

In the burst read operation thus instructed, the memory bank and the word line included therein have been selected in the row address strobe/bank active command cycle beforehand, and the memory cells of the selected word line are sequentially selected and have data consecutively read therefrom in accordance with address signals which are outputted from the column address counter 207 in synchronism with the internal clock signal. The number of the data items which are consecutively read is the number indicated by the burst length. In addition, the data read from the output buffer 211 is started after that number of the cycles of the internal clock signal which is specified by the CAS latency.

(4) Column Address Write Command (Wr)

This is used as a command necessary for starting a burst write operation when the burst write is set in the mode register 10 as the aspect of a write operation, and as a command necessary for starting a single write operation when the single write is set in the mode register 10 as the aspect of the write operation. Further, this command gives the instruction of column address strobe in the single write and the burst write.

This command is designated by the signals /CS, /CAS, /WE=low levels and the signal /RAS=high level, and an address fed to the terminals A0 through A9 is accepted as a column address signal on this occasion. The column address signal thus accepted is fed to the column address counter 207 as a burst start address in the burst write. The steps of the burst write operation thus instructed are executed similarly to those of the burst read operation. However, the CAS latency is not involved in the write operation, and the acceptance of write data is started from the column address/write command cycle.

(5) Precharge Command (Pr)

This is used as a command which starts a precharge operation for the memory bank selected in accordance with the signals A12 and A13, and which is designated by the signals /CS, /RAS, /WE=low levels and the signal /CAS=high level.

(6) Auto Refresh Command

This command is one which is required for starting auto refresh, and which is designated by the signals /CS, /RAS, /CAS=low levels and the signals /WE, CKE=high levels.

(7) Burst Stop-In-Full Page Command

This is a command necessary for stopping the burst operation of the full page in any of the memory banks, and is neglected for the burst operation of any other than the full page. This command is designated by the signals /CS, /WE=low levels and the signals /RAS, /CAS=high levels.

(8) No-operation Command (Nop)

This is a command which instructs the inhibition of any substantial operation, and which is designated by the signal /CS=low level and the high levels of the signals /RAS, /CAS, /WE.

In the SDRAM, in the case where the burst operation is being executed in one memory bank and where the row address strobe/bank active command is issued midway by indicating another memory bank, the operation of a row address system in the other memory bank is permitted without exerting any influence on the operation in one memory bank under execution. For example, the SDRAM includes means for holding therein data, addresses and control signals fed from outside, and the held contents, particularly the addresses and the control signals, are retained every memory bank though not especially restricted. Alternatively, data items which correspond to one word line in the memory block selected by the row address strobe/bank active command cycle are retained in the latch/register 213 for the read operation in advance of a column-system operation.

Accordingly, unless the data items D0–D15 collide at the data input/output terminals composed of 16 bits by way of example, the precharge command and the row address strobe/bank active command can be issued during the execution of a command whose processing has not been ended, and to any memory bank different from the memory bank which is processed by the command under execution, whereby the internal operations of the different memory bank are started beforehand. As explained above, the SDRAM of this embodiment is subjected to memory accesses in 16-bit units, it has about 4M addresses based on the addresses of the signals A0 through A11, and it is constructed of the four memory banks. In total, therefore, it has the storage capacity of, e. g., about 256 Mbits (4M×4 banks×16 bits).

Functional effects attained by the foregoing embodiments are as follows:

(1) Two memory chips each being subjected to memory accesses in 2-bit units are assembled into a structure in which they are stacked in a state where their back surfaces are placed one over the other, so as to make memory accesses in 4-bit units, thereby to bring forth the effect that a semiconductor storage device which is well adapted for use can be obtained while employing a thin package.

(2) The two memory chips are placed one over the other so as to hold their back surfaces in touch with each other, whereby a sealing resin on the back surfaces is dispensed with for the purpose of sealing and can be excluded to the utmost, and hence, the effect is brought forth that the thinning of a package can be realized.

(3) Each of the memory chips is divided into a plurality of memory banks, and when the memory chips have been placed one over the other so as to hold their back surfaces in touch, the positions of the memory banks to which the same address is assigned are made different on the back surfaces of the memory chips, thereby to bring forth the effect that places to generate heat can be dispersed.

(4) The two memory chips are placed one over the other so that their front surfaces may be opposite to each other, and they are shaped so that the sealing resin may be in touch with, at least, parts of the front surfaces held between the two memory chips, thereby to bring forth the effect that the thinning of a package can be realized.

(5) Each of the two memory chips is provided with leads of tape state on its front surface thereof, and at least, the front surface part is in touch with the sealing resin except the back surface, thereby to bring forth the effect that the structure can be thinned in spite of stacking the two memory chips.

(6) The thickness of the semiconductor storage device which includes the two memory chips held in the stacked structure is made equal to or less than the thickness of a semiconductor storage device whose storage capacity is half of or equal to the storage capacity of the former semiconductor storage device, and which has a single memory chip, thereby to bring forth the effect that the former semiconductor storage device is permitted to replace the existing (universal) semiconductor storage device.

(7) The memory chips have a facility by which a plurality of sorts of data inputting/outputting in plural-bit units, including the memory accesses in 2-bit units, are realized by employing wiring means or bonding wire and by setting signal transmission paths and/or signal levels of the memory chips, whereby many kinds of memory chips can be formed by an identical process, and hence, the effect is brought forth that mass production can be achieved.

(8) The plural-bit units are of four sorts; 2-bit units, 4-bit units, 8-bit units and 16-bit units, thereby to bring forth the effects that semiconductor storage devices of 4-, 8-, 16- and 32-bit configurations which are generally and extensively employed and which include the stacked structure of the two chips can be realized on the basis of substantially one kind of memory chip, and that a storage capacity which is, at its maximum, double the storage capacity of one memory chip can be achieved.

(9) The semiconductor storage device is formed with leads so as to extend from both side surfaces of a square resin-sealing package stretching in the longitudinal direction thereof; the 4 bits are formed by data terminals which consist of a first terminal through a fourth terminal; a pair of the first and second terminals, and a pair of the third and fourth terminals are separately disposed at positions symmetric with respect to a center line parallel to the longitudinal direction, on both sides of the square resin-sealing package; and electrodes corresponding respectively to the data terminals of 2 bits are electrically connected to the first terminal and the second terminal in each of the two memory chips; thereby to bring forth the effect that the data terminals of each of the two memory chips can be held in correspondence with the four data terminals in isolated fashion.

(10) A plurality of semiconductor storage devices, in each of which two memory chips each being subjected to memory accesses in 2-bit units are assembled into a stacked structure a state where a sealing resin is not in touch with the back surfaces of the two memory chips, so as to make memory accesses in 4-bit units, are disposed on a square mounting circuit board which is formed with electrodes along one latus thereof, thereby to bring forth the effect that a memory module which is capable of increasing the storage capacity per unit volume and high-density packaging can be obtained.

(11) A plurality of such memory modules are used in a state where the electrodes are respectively plugged into a plurality of connectors which are arranged in parallel on a mother board, thereby to bring forth the effect that an increase in a storage capacity per unit volume and high-density packaging can be realized.

(12) The two memory chips are placed one over the other so as to hold their back surfaces in touch with each other, and at least their front surfaces are in touch with the sealing resin, thereby to bring forth the effects that replacement with a universal semiconductor storage device can be realized, and that an increase in a storage capacity per unit volume and high-density packaging can be realized.

(13) The two memory chips are placed one over the other so as to hold their front surfaces in touch with each other, and the sealing resin is formed so as to be in touch with, at least the front surfaces of the two memory chips, thereby to bring forth the effects that replacement with a universal semiconductor storage device can be realized, and that an increase in a storage capacity per unit volume and high-density packaging can be realized.

(14) The thickness of the two memory chips held in the stacked structure is made equal to or less than the thickness of a single universal semiconductor storage device whose storage capacity is half of or equal to the total storage capacity of the two memory chips, thereby to bring forth the effects that replacement with a memory module employing the universal semiconductor storage device can be realized, and that an increase in the storage capacity and high-density packaging can be realized.

(15) The semiconductor storage devices are provided with a facility by which a plurality of sorts of data inputting/outputting in plural-bit units, including the memory accesses in 2-bit units, are realized by setting voltages that are applied to external terminals, thereby to bring forth the effect that the bit configurations of data terminals can be selected in mounting the semiconductor storage devices on a memory module.

(16) The plural-bit units are of four sorts; 2-bit units, 4-bit units, 8-bit units and 16-bit units, thereby to bring forth the effect that memory modules of 4-, 8-, 16- and 32-bit configurations which are generally and extensively employed and which include the stacked structure of the two chips can be obtained.

Although the inventions made by the inventors have been concretely described above on the basis of the embodiments, it is a matter of course that the invention of the present application is not restricted to the foregoing embodiments, but that it is variously alterable within a scope not departing from the purport thereof. For example, in the dynamic RAM shown in FIG. 12, the constructions of the memory array, subarray and sub word driver can adopt various aspects of performance, and the input/output interface of the dynamic RAM can adopt various aspects of performance such as ones suited to LAN bus specifications etc. other than synchronous specifications. The word lines may conform to a word shunt scheme other than the hierarchical word line scheme as stated before.

The two memory chips may be constructed from the combination of so-called "partial chips" in each of which a half storage area is validated. More specifically, the two memory chips, in each of which defects are partly existent and in each of which memory accesses can be made only to the half storage area, may be combined into the stacked structure as stated before, thereby to construct a single semiconductor storage device. In this case, when a non-defective semiconductor storage device constructed of a single memory chip is combined with the two memory chips in each of which the memory accesses can be made only to the half storage area, a semiconductor storage device which is the same as the single memory chip as externally viewed can be constructed.

The facility of making the memory accesses in 2-bit units can be effectively utilized even in the case stated above where the same semiconductor storage device as the memory chip when externally viewed is constructed by combining the two memory chips in each of which the memory accesses can be made only to the half storage area. The reason therefor is that the two memory chips whose storage areas having the same addresses assigned thereto are valid in the valid semiconductor storage device can be combined to operate as the semiconductor storage device in which memory accesses in 4-bit units can be made. Incidentally, if memory accesses in 8-bit or 16-bit units are necessary, each of the two memory chips may have a 4-bit configuration or 8-bit configuration.

Conversely, in the case where the two memory chips whose storage areas having different addresses assigned thereto are valid are combined in the valid semiconductor storage device, memory accesses are made to either of the two memory chips by address signals, so that memory accesses may be made in plural-bit units such as 4-bit, 8-bit or 16-bit units corresponding to the bus width of a memory module or the like to which the semiconductor storage device is connected, unlike the memory accesses in the 2-bit units.

Apart from the DRAM explained before, the semiconductor storage device may be a static RAM or a read-only memory such as EPROM or EEPROM. This invention can be extensively utilized for various semiconductor storage devices and memory modules each of which has a stacked structure.

An effect which is attained by a typical one of inventions disclosed in the present application is briefly explained as follows: Two memory chips each being subjected to memory accesses in 2-bit units are assembled into a stacked structure by placing their back surfaces one over the other, so as to make memory accesses in 4-bit units, whereby a semiconductor storage device which is well adapted for use can be obtained while a thin package is employed.

An effect which is attained by another typical one of the inventions disclosed in the present application is briefly explained as follows: A plurality of semiconductor storage devices, in each of which two memory chips each being subjected to memory accesses in 2-bit units are assembled into a stacked structure by placing their back surfaces one over the other, so as to make memory accesses in 4-bit units, are installed on a mounting circuit board which is square and which is formed with connector electrodes along one latus thereof, thereby to attain the effect that a memory module which is capable of increasing the storage capacity per unit volume and high-density packaging can be obtained.

We claim:

1. A semiconductor storage device comprising:

a first memory chip capable of outputting 2-bit data units at a memory access; and a second memory chip capable of outputting 2-bit data units at a memory access, wherein said first and second memory chips are stacked, and are activated to output 4-bit data units at the same memory access.

2. A semiconductor storage device according to claim 1, wherein said first and second memory chips are stacked so that back surfaces of said first and second memory chips are in contact with each other, and that, at least front surfaces of said first and second memory chips are in contact with a sealing resin.

3. A semiconductor storage device according to claim 2, wherein each of said first and second memory chips is divided into a plurality of memory banks, and, when said first and second memory chips have been stacked so that back surfaces are in contact, positions of the memory banks to which the same address is assigned are made different on said back surfaces of said first and second memory chips.

4. A semiconductor storage device according to claim 2 or 3, wherein said semiconductor storage device is formed with leads so as to extend from both side surfaces of a square resin-sealing package in a longitudinal direction thereof, wherein the 4 bits correspond to first, second, third and fourth leads for data, in which a pair of the first and second leads, and a pair of the third and fourth leads are separately disposed at positions symmetric with respect to a center line parallel to a longitudinal direction, on both sides of said square resin-sealing package, and wherein electrodes corresponding respectively to data terminals of 2 bits are electrically connected to said first and second leads in one of said first and second memory chips, while electrodes corresponding respectively to data terminals of 2 bits are electrically connected to said third and fourth leads in the other one of said first and second memory chips.

5. A semiconductor storage device according to any of claims 1 through 3, wherein a thickness of said semiconductor storage device in which said first and second memory chips are stacked and sealed is equal to or less than the thickness of a semiconductor storage device in which a single memory chip is sealed.

6. A semiconductor storage device according to any of claims 1 through 3, wherein stacked memory chips have a facility by which a plurality of sorts of data inputting/outputting in plural-bit data units, including memory accesses in 2-bit data units, are realized by employing wiring means or bonding wire and by setting signal transmission paths or signal levels of said stacked memory chips.

7. A semiconductor storage device according to claim 6, wherein the plural-bit data units include ones of 2-bit data units, 4-bit data units, 8-bit data units and 16-bit data units.

8. A semiconductor storage device comprising:
first and second memory chips each subjected to memory accesses in 2-bit data units,
wherein said first and second memory are assembled in a stacked structure so as to make memory accesses in 4-bit data units, and
wherein each of said first and second memory chips are provided with leads of tape state on a front surface thereof, and, at least, a front surface part thereof lies in contact with a sealing resin, except for a back surface of each of said first and second memory chips.

9. A semiconductor storage device according to claim 8, wherein a thickness of said stacked structure is equal to or less than the thickness of a semiconductor storage device in which a single memory chip is included.

10. A semiconductor storage device according to claim 8, wherein each of said first and second memory chips has a facility by which a plurality of sorts of data inputting/outputting in plural-bit data units, including the memory accesses in 2-bit data units, are realized by employing wiring means or bonding wire and by setting signal transmission paths or signal levels of each of said first and second memory chips.

11. A semiconductor storage device according to claim 10, wherein the plural-bit data units include ones of 2-bit data units, 4-bit data units, 8-bit data units and 16-bit data units.

12. A semiconductor storage device comprising:
two memory chips sealed by a sealing member in a state where their back surfaces are placed one over the other,
wherein each of said two memory chips are divided into a plurality of memory areas,
wherein each memory chip is subjected to memory accesses to activate ones of said memory areas in 2-bit data units, thereby to subject said two memory chips to memory accesses in 4-bit data units, and
wherein positions of activated memory areas are different on the surfaces of said two memory chips placed on each other.

13. A semiconductor storage device comprising:
first and second memory chips;
a sealing member which seals said first and second memory chips where back surfaces of said first and second memory chips are placed one over the other;
first and second leads which extend from a first latus of said sealing member to the inside and outside of said sealing member; and
third and fourth leads which extend from a second latus of said sealing member opposite to said first latus, to the inside and outside of said sealing member,
wherein each of said first and second memory chips includes first, second, third and fourth terminals for outputting data, which terminals are arranged along a straight line which is parallel to longer latera of said each of said first and second memory chips and passes through the central parts of shorter latera thereof, on a circuit forming surface of said each of said first and second memory chips,
wherein the second terminal is arranged at a position nearer to the first terminal between said first terminal and third terminal,
wherein the third terminal is arranged at a position nearer to the fourth terminal between said second terminal and fourth terminal,
wherein the first lead and the fourth lead are arranged at positions which oppose said straight line held therebetween,
wherein the second lead and the third lead are arranged at positions which oppose said straight line held therebetween, and
wherein each of said first and second memory chips outputs data in 2-bit data units by employing either of the first and second terminals, and either of the third and fourth terminals, thereby to output data from the first, second, third and fourth leads in 4-bit data units.

14. A semiconductor storage device according to claim 13,
wherein either of the first and second terminals of the first memory chip and either of the first and second terminals of the second memory chip are selectively connected to said first lead and said fourth lead through pieces of wire, respectively, and
wherein either of the third and fourth terminals of said first memory chip and either of the third and fourth terminals of said second memory chip are selectively connected to said second lead and said third lead through pieces of wire, respectively.

15. A semiconductor storage device according to claim 14, wherein each of said first and second memory chips is capable of outputting data in 4-bit data units, and that the data of 4 bits are derived from said first, second, third and fourth terminals.

16. A semiconductor storage device comprising:
first and second memory chips;
a sealing member which seals said first and second memory chips in a state where their back surfaces are placed one over the other;
a plurality of leads for addresses, which extend inside and outside said sealing member; and
a plurality of leads for data, which extend inside and outside said sealing member,
wherein each of said leads for addresses is bifurcated within said sealing member, bifurcated leads being respectively extending over front surfaces of said first and second memory chips,
wherein each of said leads for data is extended over the front surface of at least one of said first and second memory chips,
wherein each of said first and second memory chips includes a plurality of address terminals and a plurality of data terminals on its front surface,
wherein corresponding address terminals of said first and second memory chips are connected in common with the bifurcated leads for addresses through pieces of wire, respectively,
wherein said data terminals on the first memory chip and said data terminals on the second memory chip are isolated and connected to corresponding leads for data through pieces of wire and
wherein data are outputted in 2-bit units from each of said first and second memory chips, thereby to output data from said leads for data in 4-bit units.

17. A semiconductor storage device according to claim 16, wherein said leads for data are asymmetric as to their lengths extending toward said first and second memory chips.

18. A semiconductor storage device comprising a memory chip for which four sorts of data outputted in 2-bit units, 4-bit units, 8-bit units and 16-bit units can be selected by employing wiring or bonding wire and by setting signal transmission paths or signal levels of said memory chip.

* * * * *